(12) United States Patent
Kang et al.

(10) Patent No.: US 12,721,151 B2
(45) Date of Patent: Aug. 25, 2026

(54) SEMICONDUCTOR DEVICE HAVING INSULATING LAYERS WITH MULTIPLE MATERIAL PROPERTIES AND METHOD OF FABRICATING SAME

(71) Applicant: SAMSUNG ELECTRONICS CO., LTD., Suwon-si (KR)

(72) Inventors: Minjae Kang, Suwon-si (KR); Yeonggil Kim, Suwon-si (KR); Wookyung You, Suwon-si (KR); Woojin Lee, Suwon-si (KR); Jayeong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/330,672

(22) Filed: Jun. 7, 2023

(65) Prior Publication Data

US 2024/0096797 A1 Mar. 21, 2024

(30) Foreign Application Priority Data

Sep. 21, 2022 (KR) ........................ 10-2022-0119424

(51) Int. Cl.
*H10W 20/42* (2026.01)
*H10W 20/00* (2026.01)
*H10W 20/41* (2026.01)
*H10W 20/46* (2026.01)
(Continued)

(52) U.S. Cl.
CPC ....... *H10W 20/435* (2026.01); *H10W 20/063* (2026.01); *H10W 20/072* (2026.01); *H10W 20/098* (2026.01); *H10W 20/42* (2026.01); *H10W 20/46* (2026.01); *H10W 20/47* (2026.01); *H10D 84/83* (2025.01)

(58) Field of Classification Search
CPC ........... H01L 23/93295; H01L 23/5526; H01L 23/5283; H01L 21/7682; H01L 21/76838; H01L 21/76885
USPC .......................................................... 257/774
See application file for complete search history.

(56) References Cited

U.S. PATENT DOCUMENTS 5,880,018 A 3/1999 Boeck et al.
5,960,316 A 9/1999 Bai
6,133,619 A 10/2000 Sahota et al.
(Continued)

FOREIGN PATENT DOCUMENTS

CN 1379446 A * 11/2002
CN 105870102 A * 8/2016 ....... H01L 21/76831
(Continued)

*Primary Examiner* — Phuc T Dang
(74) *Attorney, Agent, or Firm* — Morgan, Lewis & Bockius LLP

(57) ABSTRACT

Disclosed is a semiconductor device including a substrate, conductive structures on the substrate and extending in parallel to each other in a first direction, and a first interlayer dielectric layer in first and second trenches between the conductive structures. A width in a second direction of the first trench may be less than a width in the second direction of the second trench. The first interlayer dielectric layer may include a lower interlayer dielectric layer and an upper interlayer dielectric layer on the lower interlayer dielectric layer, sequentially stacked. A mechanical strength of the upper interlayer dielectric layer may be greater than a mechanical strength of the lower interlayer dielectric layer.

14 Claims, 29 Drawing Sheets

(51) Int. Cl.
*H10W 20/47* (2026.01)
*H10D 84/83* (2025.01)

(56) References Cited

U.S. PATENT DOCUMENTS

| | | | | |
|---|---|---|---|---|
| 6,136,621 | A * | 10/2000 | Jones | H01J 9/025 445/51 |
| 6,294,471 | B1 * | 9/2001 | Tseng | H01L 21/76819 438/692 |
| 6,479,399 | B2 | 11/2002 | Park et al. | |
| 9,741,608 | B2 | 8/2017 | Han et al. | |
| 2004/0185678 | A1 | 9/2004 | Lee et al. | |
| 2009/0045518 | A1 | 2/2009 | Cho | |
| 2017/0207083 | A1 * | 7/2017 | Hwang | H01L 21/02318 |
| 2022/0270915 | A1 | 8/2022 | Fu et al. | |

FOREIGN PATENT DOCUMENTS

| | | | | |
|---|---|---|---|---|
| JP | H11-008244 | A | 1/1999 | |
| JP | 2005311123 | A * | 11/2005 | H01L 21/76807 |
| KR | 10-0197766 | B1 | 6/1999 | |
| KR | 10-2000-0001086 | A | 1/2000 | |
| KR | 10-0250745 | | 6/2000 | |
| KR | 10-0511091 | | 11/2005 | |
| KR | 10-0875656 | | 12/2008 | |
| KR | 10-2009-0037258 | | 4/2009 | |
| KR | 10-1061173 | | 9/2011 | |
| KR | 10-2016-0044990 | A | 4/2016 | |
| KR | 10-2019-0013227 | A | 2/2019 | |
| KR | 10-2002815 | | 7/2019 | |

* cited by examiner

ILD4
VI2
PI2
PI1
VI1
CTP2
TR2
CTP1
FT
TR1
VD1
VD2
A
A'
MIN
ILD3
ESL3
ESL2
ESL1
ESL
ILD_U
ILD_L
ILD2
ILD1
100
D3
D2

FIG. 11

A A'
MIN
ILD4
VI2
VI1
PI1
PI2
ILD3
ESL3
ESL2
ESL1
ESL
ILD_U
ILD_L
ILD2
ILD1
100
FM BM CTP1
FM BM CTP2
D3 D2

LC
100
AC
AR1
GC
SHC
GC
BD2
AR2
A'
B'
DB
AC
MIN
MIN
MIN
MIN
M2
D
D'
C
C'
BD3
DB
AC
BD4
GE
CB2
A
B
CTP2 (VSS)
CTP1
CTP1
CTP1
CTP1
CTP1
BD1
CTP2 (VDD)
M1
D1
D2
D3

SEMICONDUCTOR DEVICE HAVING INSULATING LAYERS WITH MULTIPLE MATERIAL PROPERTIES AND METHOD OF FABRICATING SAME

CROSS-REFERENCE TO RELATED APPLICATION

This U.S. nonprovisional application claims priority under 35 U.S.C § 119 to Korean Patent Application No. 10-2022-0119424, filed on Sep. 21, 2022, in the Korean Intellectual Property Office, the disclosure of which is hereby incorporated by reference in its entirety.

TECHNICAL FIELD

Embodiments of the present inventive concepts relate to a semiconductor device and a method of fabricating the same, and more particularly, to a semiconductor device including a field effect transistor and a method of fabricating the same.

DISCUSSION OF RELATED ART

A semiconductor device may include an integrated circuit having metal-oxide-semiconductor field effect transistors (MOSFETs). As sizes and design rules for semiconductor devices are gradually decreased due to advances in device integration, the sizes of the MOSFETs are also being scaled down. Scaled down MOSFETs may deteriorate operating characteristics of the semiconductor devices. For example, scaled down MOSFETs may lead to, for example, short channel effects, tunneling effects including gate leakage, and threshold voltage effects.

SUMMARY

Some embodiments of the present inventive concepts provide a semiconductor device having increased reliability and improved electrical properties and a method of fabricating the same.

According to some embodiments of the present inventive concepts, a semiconductor device may comprise: a substrate; a plurality of conductive structures on the substrate, the conductive structures extending in parallel to each other in a first direction; and a first interlayer dielectric layer in a first trench and a second trench between the conductive structures. A width in a second direction of the first trench may be less than a width in the second direction of the second trench. The first interlayer dielectric layer may include a lower interlayer dielectric layer and an upper interlayer dielectric layer on the lower interlayer dielectric layer. A mechanical strength of the upper interlayer dielectric layer may be greater than a mechanical strength of the lower interlayer dielectric layer.

According to some embodiments of the present inventive concepts, a thickness of the lower interlayer dielectric layer in the first trench may be greater than a thickness of the lower interlayer dielectric layer in the second trench.

According to some embodiments of the present inventive concepts, a hardness of the upper interlayer dielectric layer may be greater than a hardness of the lower interlayer dielectric layer, and wherein an elastic modulus of the upper interlayer dielectric layer may be greater than an elastic modulus of the lower interlayer dielectric layer. The mechanical strength of the upper interlayer dielectric layer may result from the hardness and the elastic modulus of the upper interlayer dielectric layer.

According to some embodiments of the present inventive concepts, an average size of pores in the upper interlayer dielectric layer may be less than an average size of pores in the lower interlayer dielectric layer, and a porosity of the upper interlayer dielectric layer may be less than a porosity of the lower interlayer dielectric layer. The mechanical strength of the upper interlayer dielectric layer may result from the porosity of the upper interlayer dielectric layer.

According to some embodiments of the present inventive concepts, a dielectric constant of the upper interlayer dielectric layer may be greater than a dielectric constant of the lower interlayer dielectric layer, and a concentration of carbon in the upper interlayer dielectric layer may be greater than a concentration of carbon in the lower interlayer dielectric layer. The mechanical strength of the upper interlayer dielectric layer may result from the concentration of carbon in the upper interlayer dielectric layer.

According to some embodiments of the present inventive concepts, a method of manufacturing a semiconductor device may include providing a substrate, forming a plurality of conductive structures on the substrate, the conductive structures extending in parallel to each other in a first direction, and forming a first interlayer dielectric layer in a first trench and a second trench, the first and second trenches being between the conductive structures. A width in a second direction of the first trench may be less than a width in the second direction of the second trench. Forming the first interlayer dielectric layer may include forming a lower interlayer dielectric layer in the first and second trenches and forming an upper interlayer dielectric layer on the lower interlayer dielectric layer. A mechanical strength of the upper interlayer dielectric layer may be greater than a mechanical strength of the lower interlayer dielectric layer.

BRIEF DESCRIPTION OF THE DRAWINGS

FIG. 2 illustrates a cross-sectional view taken along line A-A' of FIG. 1.

FIG. 9 illustrates a cross-sectional view taken along line A-A' of FIG. 1, showing a semiconductor device according to a comparative example.

FIG. 10 and FIG. 11 illustrate cross-sectional views taken along line A-A' of FIG. 1, showing a semiconductor device according to some embodiments of the present inventive concepts.

DETAILED DESCRIPTION

Figure 1:
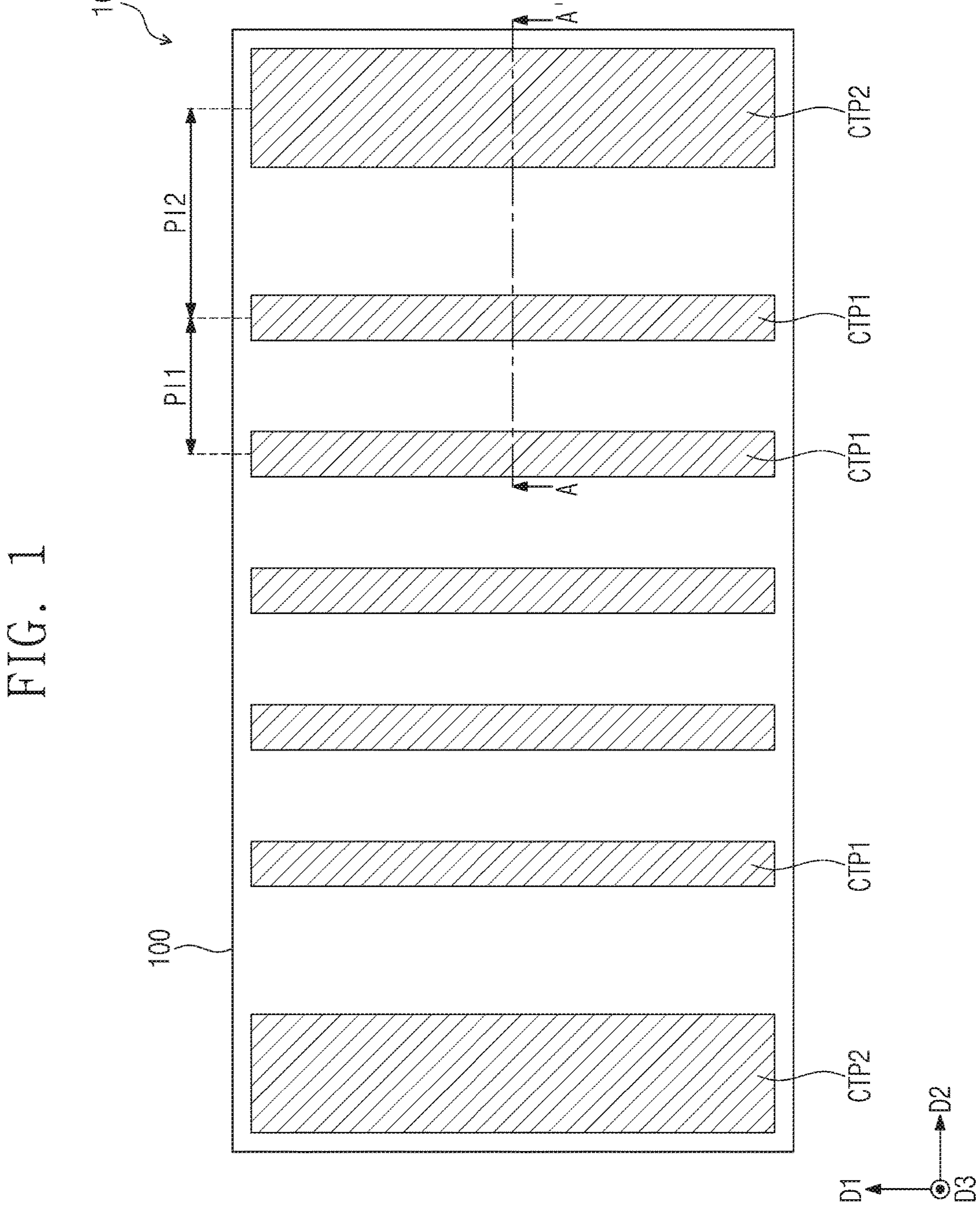
FIG. 1 illustrates a plan view showing a semiconductor device according to some embodiments of the present inventive concepts.

FIG. 1 illustrates a plan view showing a semiconductor device according to some embodiments of the present inventive concepts. A semiconductor device 10 according to some embodiments of the present inventive concepts may include structures free of process defects and have improved electrical properties. For example, the semiconductor device 10 may include a stack of interlayer dielectric layers, which have different properties, that may prevent a bridge structure type process defect. In another example, an air gap may be formed in an interlay dielectric layer, which may reduce a parasitic capacitance.

Referring to FIG. 1, the semiconductor device 10 may include a substrate 100 and a plurality of conductive structures CTP1 and CTP2. The conductive structures CTP1 and CTP2 may have linear shapes that extend in a first direction D1. The conductive structures CTP1 and CTP2 may be arranged along a second direction D2. The conductive structures CTP1 and CTP2 may include first conductive structures CTP1 and second conductive structures CTP2.

Figure 2:
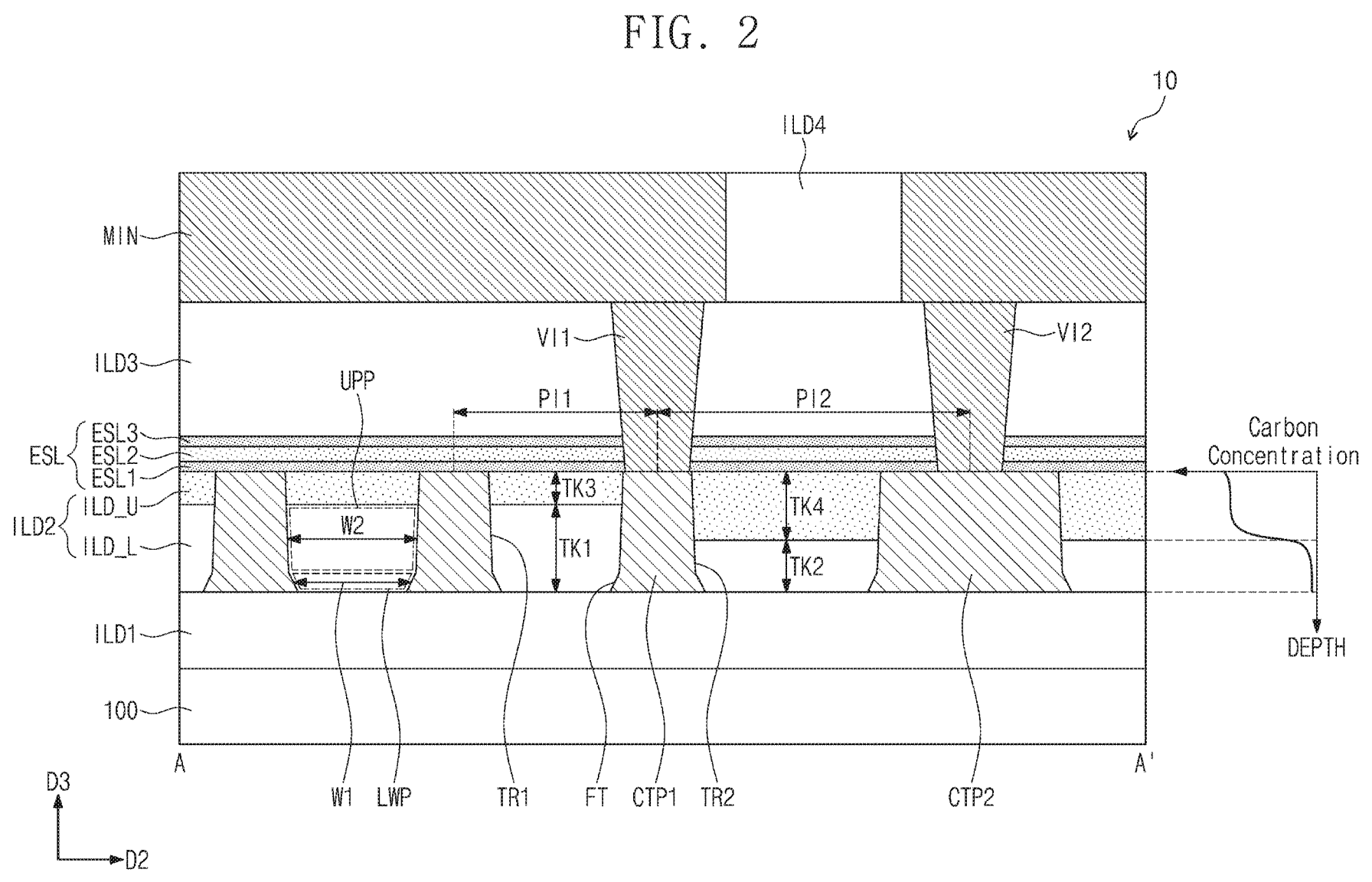

FIG. 2 illustrates a cross-sectional view taken along line A-A' of FIG. 1.

Referring to FIG. 2, a first interlayer dielectric layer ILD1 may be provided on the substrate 100. In some examples, the substrate 100 may be a compound semiconductor substrate. In some examples, the substrate 100 may be a semiconductor substrate including, for example, silicon, germanium, or silicon-germanium. For example, the substrate 100 may be a silicon substrate. The substrate 100 may include a conductive region, for example, an impurity-doped well or an impurity-doped structure. The substrate 100 may include a device isolation structure such as shallow trench isolation (STI).

In an embodiment of the present inventive concepts, a plurality of individual devices (not illustrated) may be provided between the first interlayer dielectric layer ILD1 and the substrate 100. The plurality of individual devices may include various microelectronic devices, for example, a metal-oxide-semiconductor field effect transistor (MOSFET), a system large scale integration (system LSI), an image sensor such as complementary metal-oxide-semiconductor image sensor (CIS), a micro-electro-mechanical system (MEMS), an active device, a passive device, and so forth. The plurality of individual devices may be electrically connected to the conductive region of the substrate 100. The first interlayer dielectric layer ILD1 and/or the device isolation structure may electrically separate the plurality of individual devices from each other.

A middle-of-line (MOL) layer (not illustrated) may be provided in the first interlayer dielectric layer ILD1. The MOL layer may include contacts electrically connected to the plurality of individual devices, such as a plurality of transistors, formed on the substrate 100.

A second interlayer dielectric layer ILD2 may be provided on the first interlayer dielectric layer ILD1. The second interlayer dielectric layer ILD2 may include a lower interlayer dielectric layer ILD_L and an upper interlayer dielectric layer ILD_U. The lower interlayer dielectric layer ILD_L and the upper interlayer dielectric layer ILD_U may be sequentially stacked. In other words, the second interlayer dielectric layer ILD2 may have a double-layer structure.

According to some embodiments of the present inventive concepts, the plurality of conductive structures CTP1 and CTP2 may be provided in the second interlayer dielectric layer ILD2. A line-width of the first conductive structure CTP1 may be less than a line-width of the second conductive structure CTP2. A first pitch PI1 may be an interval between neighboring first conductive structures CTP1. A second pitch PI2 may be an interval between the first conductive structure CTP1 and the second conductive structure CTP2 adjacent thereto. The second pitch PI2 may be greater than the first pitch PI1. Each of the first conductive structures CTP1 and the second conductive structures CTP2 may include ruthenium (Ru), molybdenum (Mo), tungsten (W), cobalt (Co), or a binary metal alloy including a combination thereof.

Each of the first conductive structures CTP1 and the second conductive structures CTP2 may have a width that gradually increases with depth in a direction from top toward bottom surfaces thereof. For example, each of the first conductive structures CTP1 and the second conductive structures CTP2 may have a trapezoidal shape when viewed in vertical section. The first conductive structures CTP1 and the second conductive structures CTP2 may be formed by an anisotropic etching process performed on a metal layer. Each of the first conductive structures CTP1 and the second conductive structures CTP2 may include a protruding footing FT at a lower portion thereof.

The lower interlayer dielectric layer ILD_L and the upper interlayer dielectric layer ILD_U may be stacked in a trench between neighboring conductive structures CTP1 and CTP2. The lower interlayer dielectric layer ILD_L and the upper interlayer dielectric layer ILD_U may include a same dielectric material as each other or different dielectric materials from each other.

Each of the lower interlayer dielectric layer ILD_L and the upper interlayer dielectric layer ILD_U may include, for example, at least one of a silicon oxide (SiO), a carbon doped silicon oxide (e.g., SiOC or SiOCH), or a silicon oxynitride (SiON). In some embodiments of the present inventive concepts, in a case where the lower interlayer dielectric layer ILD_L and the upper interlayer dielectric layer ILD_U include the same dielectric material, there may be a difference in a ratio of specific elements (e.g., a difference in a concentration of carbon) between the lower interlayer dielectric layer ILD_L and the upper interlayer dielectric layer ILD_U. Therefore, a boundary (or interface) may be disposed between the lower interlayer dielectric layer ILD_L and the upper interlayer dielectric layer ILD_U.

In an embodiment of the present inventive concepts, as shown in FIG. 2, the second interlayer dielectric layer ILD2 may have a relatively high carbon concentration in the upper interlayer dielectric layer ILD_U. The carbon concentration may decrease at a boundary between the upper interlayer dielectric layer ILD_U and the lower interlayer dielectric layer ILD_L. The lower interlayer dielectric layer ILD_L may have a relatively low carbon concentration. Stated another way, the carbon concentration in the second interlayer dielectric layer ILD2 decreases with increased depth.

The lower interlayer dielectric layer ILD_L and the upper interlayer dielectric layer ILD_U may be formed by different processes. For example, the lower interlayer dielectric layer ILD_L may be formed by a flow fill process or a spin-on process. The upper interlayer dielectric layer ILD_U may be formed by a chemical vapor deposition process such as plasma-enhanced chemical vapor deposition (PECVD).

The upper interlayer dielectric layer ILD_U may be denser than the lower interlayer dielectric layer ILD_L. An average size of pores in the upper interlayer dielectric layer ILD_U may be less than an average size of pores in the lower interlayer dielectric layer ILD_L. The upper interlayer dielectric layer ILD_U may have a porosity less than a porosity of the lower interlayer dielectric layer ILD_L.

The upper interlayer dielectric layer ILD_U may have a dielectric constant greater than a dielectric constant of the lower interlayer dielectric layer ILD_L. For example, the upper interlayer dielectric layer ILD_U may have a dielectric constant of about 2.4 to about 3.0, and the lower interlayer dielectric layer ILD_L may have a dielectric constant of about 1.9 to about 2.7.

The upper interlayer dielectric layer ILD_U may have a hardness greater than a hardness of the lower interlayer dielectric layer ILD_L. For example, the upper interlayer dielectric layer ILD_U may have a hardness of about 1.0 GPa to about 3.0 GPa, and the lower interlayer dielectric layer ILD_L may have a hardness of about 0.2 GPa to about 1.5 GPa.

The upper interlayer dielectric layer ILD_U may have an elastic modulus greater than an elastic modulus of the lower interlayer dielectric layer ILD_L. For example, the upper interlayer dielectric layer ILD_U may have an elastic modulus of about 5 GPa to about 12 GPa, and the lower interlayer dielectric layer ILD_L may have an elastic modulus of about 2 GPa to about 12 GPa. Stated another way, the upper interlayer dielectric layer ILD_U may be formed of a layer whose stiffness may be greater than a stiffness of the lower interlayer dielectric layer ILD_L.

A first trench TR1 may be defined between the first conductive structures CTP1. The first conductive structures CTP1 may have the first pitch PH as an interval therebetween. A second trench TR2 may be defined between the first conductive structures CTP1 and the second conductive structures CTP2. The first conductive structures CTP1 and the second conductive structures CTP2 may have the second pitch PI2 as an interval therebetween. A width in the second direction D2 of the second trench TR2 may be greater than a width in the second direction D2 of the first trench TR1.

The lower interlayer dielectric layer ILD_L may have different thicknesses in different locations. For example, the lower interlayer dielectric layer ILD_L in the first trench TR1 may have a first thickness TK1. The lower interlayer dielectric layer ILD_L in the second trench TR2 may have a second thickness TK2. The first thickness TK1 may be greater than the second thickness TK2.

The upper interlayer dielectric layer ILD_U may have different thicknesses in different locations. For example, the upper interlayer dielectric layer ILD_U in the first trench TR1 may have a third thickness TK3. The upper interlayer dielectric layer ILD_U in the second trench TR2 may have a fourth thickness TK4. The third thickness TK3 may be less than the fourth thickness TK4.

In an embodiment of the present inventive concepts, the lower interlayer dielectric layer ILD_L in the first trench TR1 may include a lower part LWP between the footings FT of the first conductive structures CTP1 and an upper part UPP on the lower part LWP. The lower part LWP may have a first width W1 in the second direction D2, and the upper part UPP may have a second width W2 in the second direction D2. The second width W2 may be greater than the first width W1.

The footings FT of the first conductive structures CTP1 may cause the lower part LWP to have an inverted dome shape. The footings FT of the first conductive structures CTP1 may lead to a tapering in the first width W1 of the lower part LWP. That is, the first width W1 may be an average width of the lower part LWP. An actual width of the lower part LWP may taper with depth.

The upper interlayer dielectric layer ILD_U may have a top surface coplanar with top surfaces of the conductive structures CTP1 and CTP2. The top surface of the upper interlayer dielectric layer ILD_U in the first trench TR1 may be coplanar with a top surface of the upper interlayer dielectric layer ILD_U in the second trench TR2.

The top surfaces of upper interlayer dielectric layer ILD_U and the conductive structures CTP1 and CTP2 may be flat. An etch stop layer ESL may be provided on each of the top surfaces of the upper interlayer dielectric layer ILD_U and the conductive structures CTP1 and CTP2.

In an embodiment of the present inventive concepts, the etch stop layer ESL may include a first etch stop layer ESL1, a second etch stop layer ESL2, and a third etch stop layer ESL3. The first etch stop layer ESL1, the second etch stop layer ESL2, and the third etch stop layer ESL3 may be sequentially stacked. The first etch stop layer ESL1 may directly cover the top surface of the upper interlayer dielectric layer ILD_U and the top surfaces of the conductive structures CTP1 and CTP2. The second etch stop layer ESL2 may cover a top surface of the first etch stop layer ESL1. The third etch stop layer ESL3 may cover a top surface of the second etch stop layer ESL2.

The first etch stop layer ESL1 may be a high-k dielectric layer and a low-density layer as well. The first etch stop layer ESL1 may be one of a metal oxide layer or a metal nitride layer. The metal oxide layer and the metal nitride layer may each contain at least one of aluminum (Al), zirconium (Zr), yttrium (Y), hafnium (Hf), or Mo. For example, the first etch stop layer ESL1 may include aluminum oxide, hafnium oxide, hafnium zirconium oxide, aluminum nitride, hafnium nitride, or hafnium zirconium nitride.

The second etch stop layer ESL2 may be a low-k dielectric layer and a high-density layer as well. The second etch stop layer ESL2 may have a dielectric constant less than a dielectric constant of the first etch stop layer ESL1. The second etch stop layer ESL2 may have a density greater than a density of the first etch stop layer ESL1.

The second etch stop layer ESL2 may contain an x material, a y material, and carbon (C). The x material may be an element such as silicon (Si), germanium (Ge), Al, Zr, Y, Hf, and Mo, and the y material may be oxygen (O) or nitrogen (N). For example, the second etch stop layer ESL2 may include a SiOC, a silicon carbon nitrides (SiCN), a germanium oxide (GeOC), or a germanium carbon nitrides (GeCN).

The second etch stop layer ESL2 may have a carbon concentration of about 10 at % to about 25 at %, where at % is the atomic concentration. For example, the second etch stop layer ESL2 may have a carbon concentration of about 15 at % to about 20 at %. A concentration of the x material in the second etch stop layer ESL2 may range from about 30 at % to about 50 at %.

The third etch stop layer ESL3 may include metal oxide that contains, for example, at least one of Al, Zr, Y, Hf, or Mo. For example, the third etch stop layer ESL3 may include aluminum oxide. In an embodiment, the third etch stop layer ESL3 may include a same material as the first etch stop layer ESL1. In another embodiment, the third etch stop layer ESL3 may include a material different than the first etch stop layer ESL1.

The third etch stop layer ESL3 may have a dielectric constant greater than a dielectric constant of the second etch stop layer ESL2. The third etch stop layer ESL3 may have a density less than a density of the second etch stop layer ESL2.

The second etch stop layer ESL2 may have a thickness greater than a thickness of the first etch stop layer ESL1 and greater than a thickness of the third etch stop layer ESL3. For example, each of the first etch stop layer ESL1 and the third etch stop layer ESL3 may have a thickness of about 2 nm to about 5 nm. The second etch stop layer ESL2 may have a thickness of about 3 nm to about 10 nm.

According to some embodiments of the present inventive concepts, the etch stop layer ESL may have a triple-layered structure formed of the first etch stop layer ESL1, the second etch stop layer ESL2, and the third etch stop layer ESL3. It may be possible to achieve a high etch selectivity through the triple etch stop layer ESL according to an embodiment of the present inventive concepts. According to some embodiments of the present inventive concepts, the triple etch stop layer ESL may prevent process faults. For example, in a case where process faults may not be formed, the first via VI1 and the second via VI2 may be formed in stable contact with the first conductive structure CTP1 and the second conductive structure CTP2, respectively.

A third interlayer dielectric layer ILD3 may be provided on the etch stop layer ESL. First via VI1 and the second via VI2 may be provided which penetrate the third interlayer dielectric layer ILD3 and the etch stop layer ESL and which are respectively coupled to the first and second conductive structures CTP1 and CTP2. The first via VI1 and the second via VI2 may have top surfaces coplanar with the top surface of the third interlayer dielectric layer ILD3.

A fourth interlayer dielectric layer ILD4 may be provided on the third interlayer dielectric layer ILD3. The fourth interlayer dielectric layer ILD4 may be provided with metal lines MIN therein. The metal lines MIN may be correspondingly connected to the first via VI1 and the second via VI2.

The first via VI1, the second via VI2, and the metal lines MIN may each include at least one of copper (Cu), aluminum (Al), ruthenium (Ru), cobalt (Co), tungsten (W), molybdenum (Mo), aluminum binary alloy (e.g., $Al_3Sc$, $Nb_3Al$, or AlRu), Mo binary alloy (e.g., MoTa or $Co_3Mo$), Ru binary alloy, Ni binary alloy, MAX, or any combination thereof. The MAX may be a material represented by $M_{n+1}AX_n$, where n is 1, 2, or 3, M is a transition metal, A is an element selected from Group 13 or 14 of the Periodic Table of the Elements, and X is carbon (C) and/or nitrogen (N). For example, the MAX may be $V_2SiN$, $V_2AlC$, or $Cr_2AlC$.

In an embodiment, the first via VI1 and the second via VI2 and the metal lines MIN may each further include a barrier layer. The barrier layer may include, for example, at least one of a tantalum nitride (TaN) layer, a titanium nitride (TiN) layer, a tantalum oxide (TaO) layer, a titanium oxide (TiO) layer, a manganese nitride (MnN) layer, or a manganese oxide (MnO) layer.

The conductive structures CTP1 and CTP2 and the second interlayer dielectric layer ILD2 may each be an example of a specific metal layer in a back-end-of-line (BEOL) layer. The conductive structures CTP1 and CTP2 and the second interlayer dielectric layer ILD2 according to an embodiment may be applicable not only to a specific metal layer, but to other metal layers, for example, at least one of M1, M2, M3, M4, or M5. The conductive structures CTP1 and CTP2 according to an embodiment may also be substantially similar to conductive structures (e.g., gate electrode) in a front-end-of-line (FEOL) layer or conductive structures (e.g., active contact) in a middle-of-line (MOL) layer, and the present inventive concepts are not limited thereto.

According to some embodiments of the present inventive concepts, a lower interlayer dielectric layer, whose dielectric constant is relatively small, may be provided between neighboring conductive structures CTP1 and CTP2. The lower interlayer dielectric layer may reduce a parasitic capacitance between the conductive structures CTP1 and CTP2. Therefore, a device may have improved electrical properties. In addition, an upper interlayer dielectric layer whose mechanical strength is relatively greater than a mechanical strength of the lower interlayer dielectric layer may be formed on the lower interlayer dielectric layer. The upper interlayer dielectric layer and the conductive structures CTP1 and CTP2 may have flat top surfaces coplanar with each other. With coplanar top surfaces forming a top-tier layer, when a process is performed on the top-tier layer, it may be possible to prevent a process fault such as a bridge structure BRG, which may increase reliability of devices.

According to some embodiments of the present inventive concepts, the mechanical strength of the upper interlayer dielectric layer may result from properties of the upper interlayer dielectric layer. For example, the properties may include a concentration of carbon, hardness, and porosity. The properties may be described as being relative to properties of the lower interlayer dielectric layer. For example, the mechanical strength of the upper interlayer dielectric layer may result from a hardness and an elastic modulus of the upper interlayer dielectric layer. In another example, the mechanical strength of the upper interlayer dielectric layer may result from the porosity of the upper interlayer dielectric layer. In a further example, the mechanical strength of the upper interlayer dielectric layer may result from the concentration of carbon in the upper interlayer dielectric layer.

FIGS. 3 to 8 illustrate cross-sectional views taken along line I-I' of FIG. 1. FIGS. 3 to 8 illustrate a method of fabricating a semiconductor device according to some embodiments of the present inventive concepts.

Figure 3:
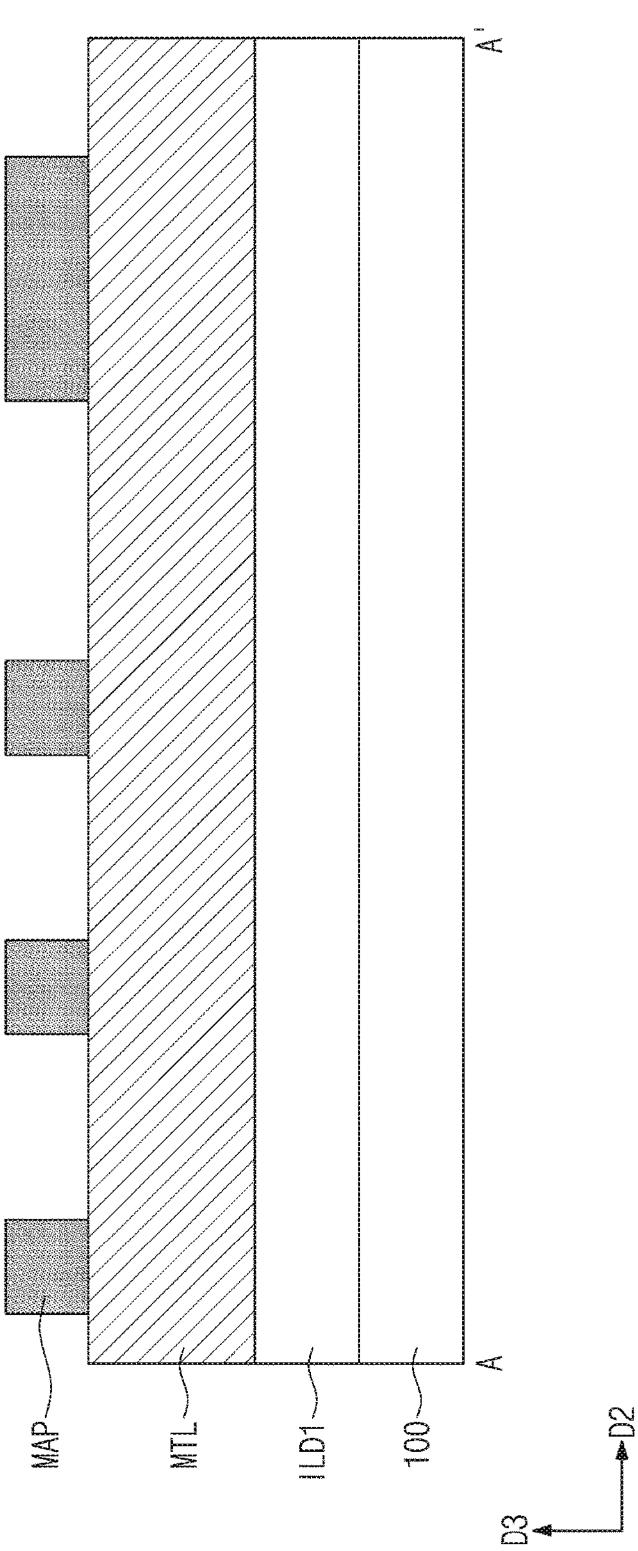
FIG. 3, FIG. 4, FIG. 5, FIG. 6, FIG. 7, and FIG. 8 illustrate cross-sectional views taken along line I-I' of FIG. 1, showing a method of fabricating a semiconductor device according to some embodiments of the present inventive concepts.

Referring to FIGS. 1 and 3, a plurality of individual devices may be formed on a substrate 100, and a first interlayer dielectric layer ILD1 may be formed on the substrate 100 to cover the plurality of individual devices. A conductive layer MTL may be formed on the first interlayer dielectric layer ILD1.

In an embodiment of the present inventive concepts, the conductive layer MTL may include a metal capable of being directly formed, without barrier metal, on the first interlayer dielectric layer ILD1. The conductive layer MTL may include a metal that can be patterned by an etching process. For example, the conductive layer MTL may include molybdenum (Mo), ruthenium (Ru), tungsten (W), cobalt (Co), or a binary metal alloy including a combination thereof.

A plurality of mask patterns MAP may be formed on the conductive layer MTL. Each of the mask patterns MAP may have a linear shape that extends in a first direction D1. The plurality of mask patterns MAP may define each of a plurality of conductive structures CTP1 and CTP2, which may be formed subsequently. The formation of the plurality of mask patterns MAP may include performing a litho-etch-litho-etch (LELE) process, a multi-patterning process such as double patterning technology (DPT) or quadruple patterning technology (QPT), or an extreme ultraviolet (EUV) lithography process. The mask patterns MAP may include, for example, silicon nitride.

Figure 4:
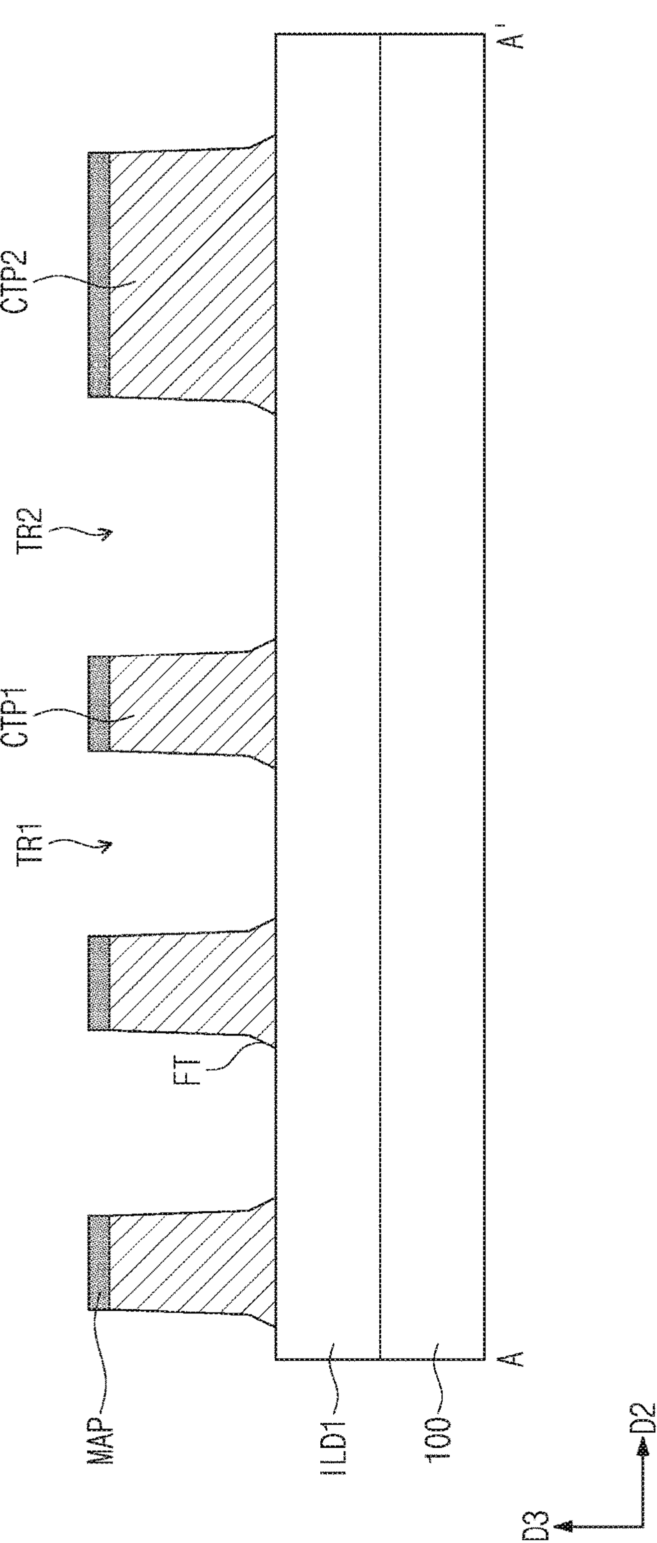

Referring to FIGS. 1 and 4, the mask patterns MAP may be used as an etching mask. Portions of the conductive layer MTL exposed by the mask patterns MAP may be etched and a plurality of conductive structures CTP1 and CTP2 may be formed. Each of the conductive structures CTP1 and CTP2 may have a linear shape that extends in the first direction D1. Each of the conductive structures CTP1 and CTP2 may include a footing FT at a lower portion thereof. The plurality of conductive structures CTP1 and CTP2 may include first conductive structures CTP1 and second conductive structures CTP2.

A first trench TR1 may be formed between the first conductive structures CTP1 having a first pitch PI1 as an interval therebetween. A second trench TR2 may be formed between the first and second conductive structures CTP1 and CTP2 having a second pitch PI2 as an interval therebetween. A width in a second direction D2 of the second trench TR2 may be greater than a width in the second direction D2 of the first trench TR1.

Figure 5:
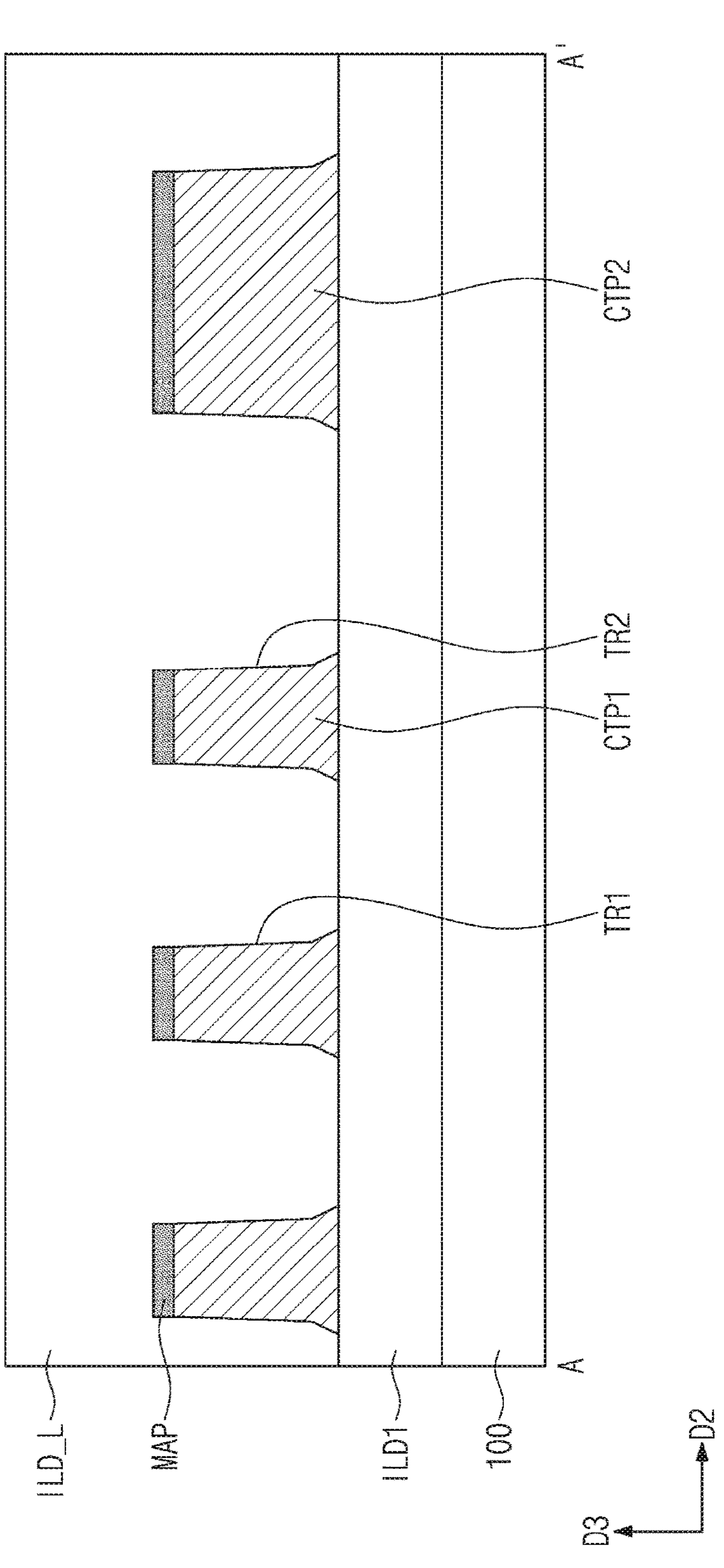

Referring to FIGS. 1 and 5, a lower interlayer dielectric layer ILD_L may be formed to cover the plurality of conductive structures CTP1 and CTP2. For example, the lower interlayer dielectric layer ILD_L may be formed by a flow fill process or a spin-on process. The lower interlayer dielectric layer ILD_L may include a silicon-based dielectric material (e.g., SiO, SiOC, SiOCH, or SiON). The lower interlayer dielectric layer ILD_L may be porous, and may have low density and low hardness. The lower interlayer dielectric layer ILD_L may fill the first trench TR1 and the second trench TR2.

Figure 6:
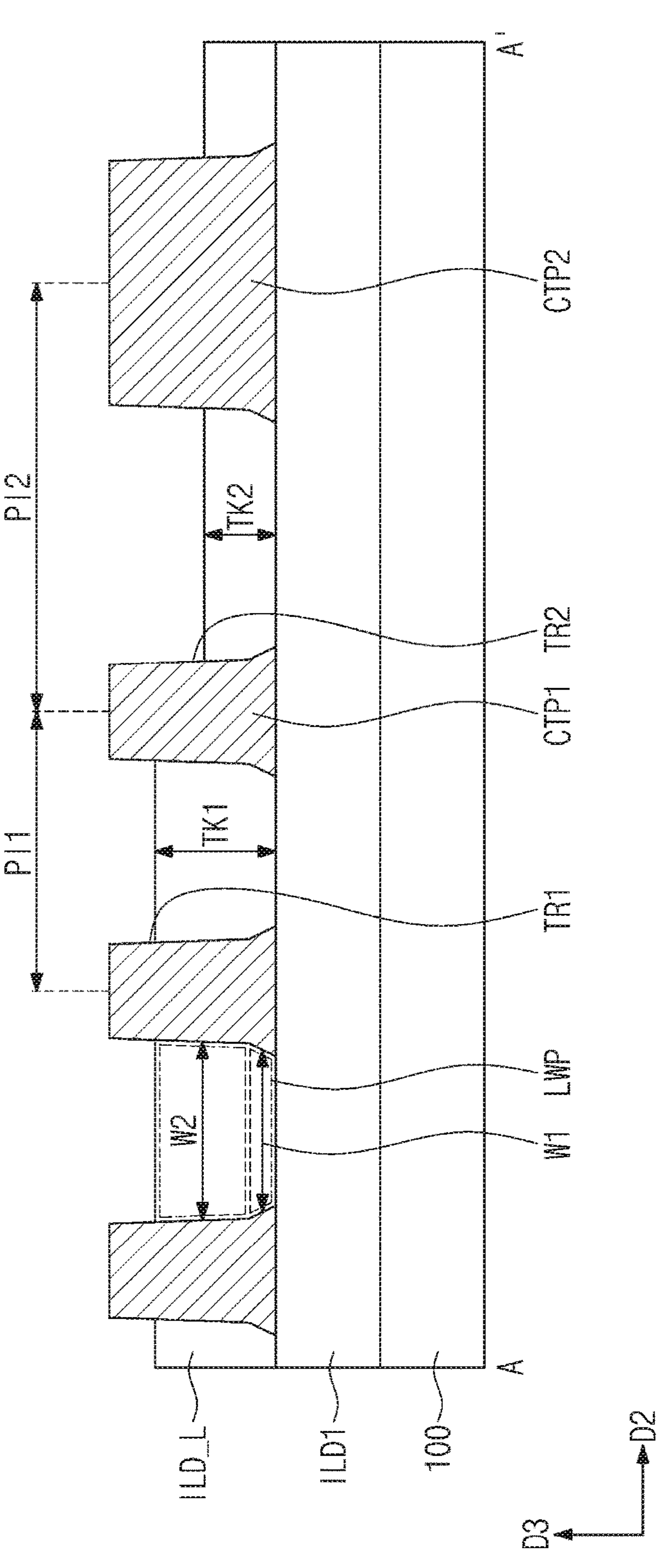

Referring to FIGS. 1 and 6, a planarization process may be performed on the lower interlayer dielectric layer ILD_L. The planarization process may expose the mask patterns MAP. The exposed mask patterns MAP may be exposed to an etching process to remove the mask patterns MAP.

The planarization process and the etching process may cause the lower interlayer dielectric layer ILD_L to have a reduced thickness. A top surface of the lower interlayer dielectric layer ILD_L may be lower than top surfaces of each of the conductive structures CTP1 and CTP2.

The lower interlayer dielectric layer ILD_L may be formed to have a thickness that is different at different locations. For example, the lower interlayer dielectric layer ILD_L in the first trench TR1 may be formed to have a first thickness TK1. The lower interlayer dielectric layer ILD_L in the second trench TR2 may be formed to have a second thickness TK2 less than the first thickness TK1.

Because an interval (or the first pitch PI1) between neighboring first conductive structures CTP1 is narrower than an interval (or the second pitch PI2) between neighboring first and second conductive structures CTP1 and CTP2, an amount of the lower interlayer dielectric layer ILD_L removed between neighboring first conductive structures CTP1 may be less than an amount of the lower interlayer dielectric layer ILD_L removed between neighboring first and second conductive structures CTP1 and CTP2.

The lower interlayer dielectric layer ILD_L may be relatively soft layer, and thus a dishing phenomenon may occur during the planarization process. For example, a relatively heavy dishing phenomenon may occur in the lower interlayer dielectric layer ILD_L in the second trench TR2. In contrast, a relatively light dishing phenomenon may occur in the lower interlayer dielectric layer ILD_L in the first trench TR1.

Figure 7:
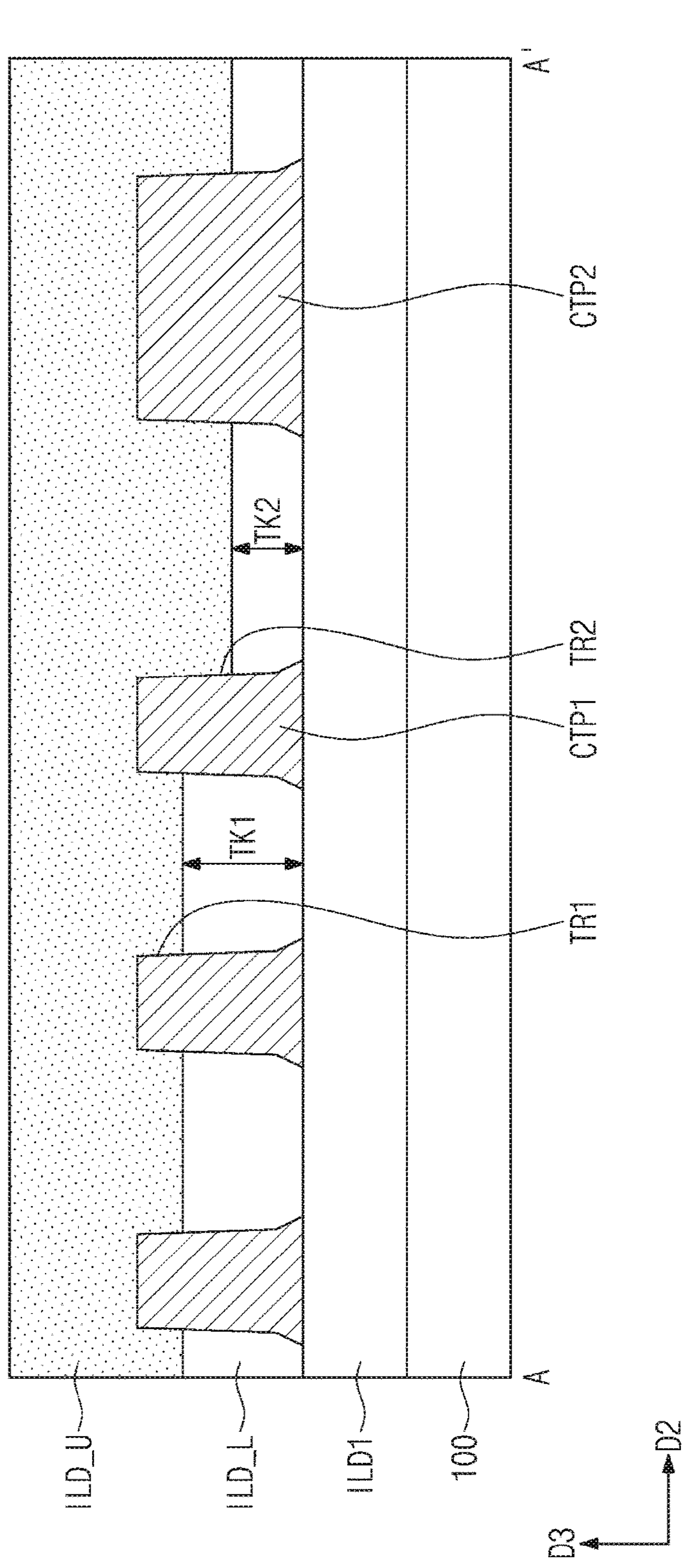

Referring to FIGS. 1 and 7, an upper interlayer dielectric layer ILD_U may be formed on the lower interlayer dielectric layer ILD_L, covering the plurality of conductive structures CTP1 and CTP2. The upper interlayer dielectric layer ILD_U may be formed to fill the first trench TR1 and second trench TR2. The upper interlayer dielectric layer ILD_U may be formed by a chemical vapor deposition process such as plasma-enhanced chemical vapor deposition (PECVD).

The upper interlayer dielectric layer ILD_U may include a silicon-based dielectric material (e.g., SiO, SiOC, SiOCH, or SiON). The upper interlayer dielectric layer ILD_U may be a dense and hard material. A chemical vapor deposition (CVD) process may be used to form the upper interlayer dielectric layer ILD_U whose density and carbon concentration are greater than the density and carbon concentration of the lower interlayer dielectric layer ILD_L. Therefore, the upper interlayer dielectric layer ILD_U may be mechanically stronger and harder than the lower interlayer dielectric layer ILD_L.

Figure 8:
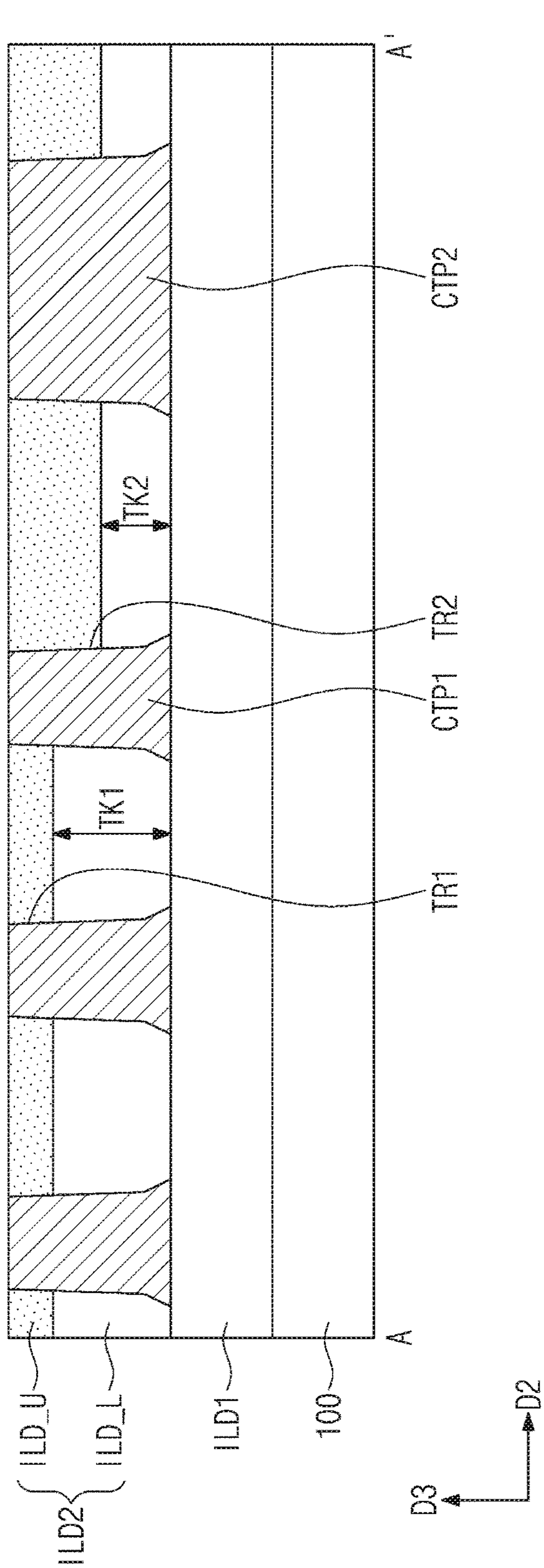

Referring to FIGS. 1 and 8, a planarization process may be performed on the upper interlayer dielectric layer ILD_U. The planarization process may expose the top surfaces of the conductive structures CTP1 and CTP2. Therefore, a top surface of the upper interlayer dielectric layer ILD_U may be coplanar with the top surfaces of the conductive structures CTP1 and CTP2. The upper interlayer dielectric layer ILD_U and the conductive structures CTP1 and CTP2 may be formed to have top surfaces that are flat (or not rugged), without step difference. In the planarization process on the upper interlayer dielectric layer ILD_U, a dishing phenomenon may not occur due to a relatively high hardness of the upper interlayer dielectric layer ILD_U. A second interlayer dielectric layer ILD2 may be constituted by the lower interlayer dielectric layer ILD_U and the upper interlayer dielectric layer ILD_U that are sequentially stacked.

Referring again to FIGS. 1 and 2, an etch stop layer ESL may be formed on the second interlayer dielectric layer ILD2. The formation of the etch stop layer ESL may include sequentially forming first etch stop layer ESL1, second etch stop layer ESL2, and third etch stop layer ESL3.

The first etch stop layer ESL1 may be first formed. The first etch stop layer ESL1 may cover the top surface of the upper interlayer dielectric layer ILD_U and the top surfaces of the conductive structures CTP1 and CTP2. The first etch stop layer ESL1 may be formed to have a thickness of about 2 nm to about 5 nm. The first etch stop layer ESL1 may be formed of a material with high-k dielectric and low density properties. The first etch stop layer ESL1 may include metal oxide that contains, for example, at least one of Al, Zr, Y, Hf, or Mo. The first etch stop layer ESL1 may have an etch selectivity with respect to the upper interlayer dielectric layer ILD_U.

The second etch stop layer ESL2 may be formed on the first etch stop layer ESL1. The second etch stop layer ESL2 may be formed to have a thickness of about 3 nm to about 10 nm. The thickness of the second etch stop layer ESL2 may be greater than a thickness of the first etch stop layer ESL1. The second etch stop layer ESL2 may be formed of a material with low-k dielectric and high density properties. The second etch stop layer ESL2 may contain x material, y material, and carbon (C). The x material may be Si, Ge, Al, Zr, Y, Hf, or Mo, and the y material may be 0 or N.

The third etch stop layer ESL3 may be formed on the second etch stop layer ESL2. The third etch stop layer ESL3 may be formed to have a thickness of about 2 nm to about 5 nm. The thickness of the third etch stop layer ESL3 may be the same as or similar to the thickness of the first etch stop layer ESL1. The third etch stop layer ESL3 may be a metal oxide layer that contains at least one of Al, Zr, Y, Hf, or Mo. For example, the third etch stop layer ESL3 may include the same material as that of the first etch stop layer ESL1.

A third interlayer dielectric layer ILD3 may be formed on the third etch stop layer ESL3. Via holes may be formed to penetrate the third interlayer dielectric layer ILD3 and the etch stop layer ESL and to expose the conductive structures CTP1 and CTP2. The via holes may be filled with metal to form a first via VI1 and a second via VI2.

A fourth interlayer dielectric layer ILD4 may be formed on the third interlayer dielectric layer ILD3. Metal lines MIN may be formed in the fourth interlayer dielectric layer ILD4 to correspondingly have connection with the first via VI1 and the second via VI2.

Figure 9:
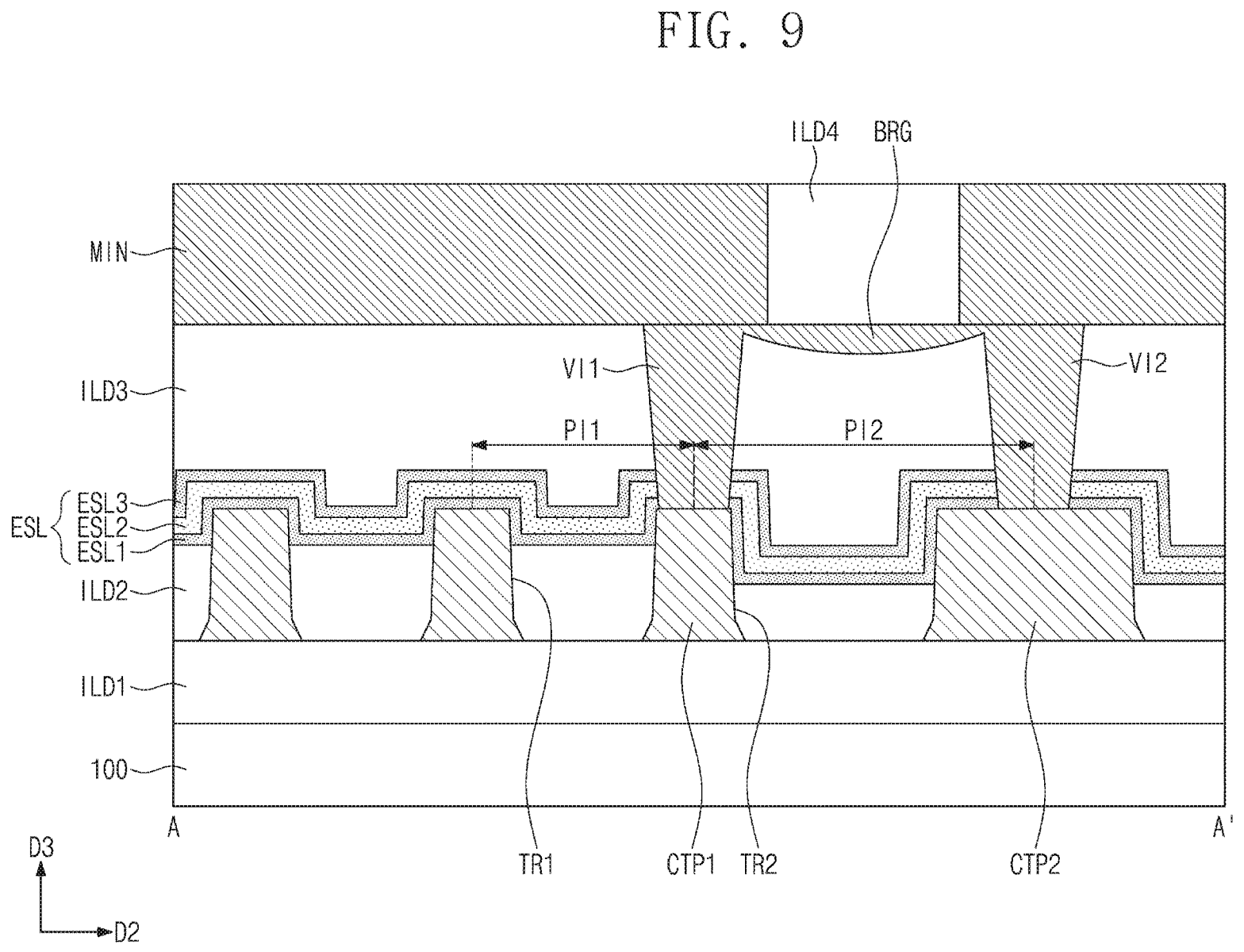

FIG. 9 illustrates a cross-sectional view taken along line A-A' of FIG. 1, showing a semiconductor device according to a comparative example. Referring to FIG. 9, according to a comparative example of the present inventive concepts, the second interlayer dielectric layer ILD2 may be formed to have a single-layered structure. For example, the second interlayer dielectric layer ILD2 according to the comparative example may be formed of only the lower interlayer dielectric layer ILD_L, and the upper interlayer dielectric layer ILD_U of FIG. 2 may be omitted.

The etch stop layer ESL may be directly formed on the lower interlayer dielectric layer ILD_L discussed above with reference to FIG. 6, or on the second interlayer dielectric layer ILD2. A top surface of the second interlayer dielectric layer ILD2 may not be coplanar with top surfaces of the conductive structures CTP1 and CTP2. The second interlayer dielectric layer ILD2 and the conductive structures CTP1 and CTP2 may have top surfaces with different levels at different locations.

A bridge structure BRG may be provided between the first via VI1 and the second via VI2. The bridge structure BRG may connect the first via VI1 and the second via VI2 to each other. For example, the bridge structure BRG may cause an electrical short-circuit between the first via VI1 and the second via VI2. This may serve as a process defect.

The second interlayer dielectric layer ILD2 in the second trench TR2 may be formed to have a relatively small thickness, and thus the third interlayer dielectric layer ILD3 on the second trench TR2 may have a concave top surface. The concave top surface may be filled with metal to form the bridge structure BRG of FIG. 9.

In contrast, as regards a semiconductor device shown in FIG. 2 according to some embodiments of the present inventive concepts, the second interlayer dielectric layer ILD2 may include the soft lower interlayer dielectric layer ILD_L, and the hard upper interlayer dielectric layer ILD_U on the lower interlayer dielectric layer ILD_L, and thus it may be possible to prevent a downward collapse of an interlayer dielectric layer on the second trench TR2. Accordingly, embodiments of the present inventive concepts may prevent process defects such as the bridge structure BRG shown in FIG. 9 and increase reliability of semiconductor devices.

Figure 10:
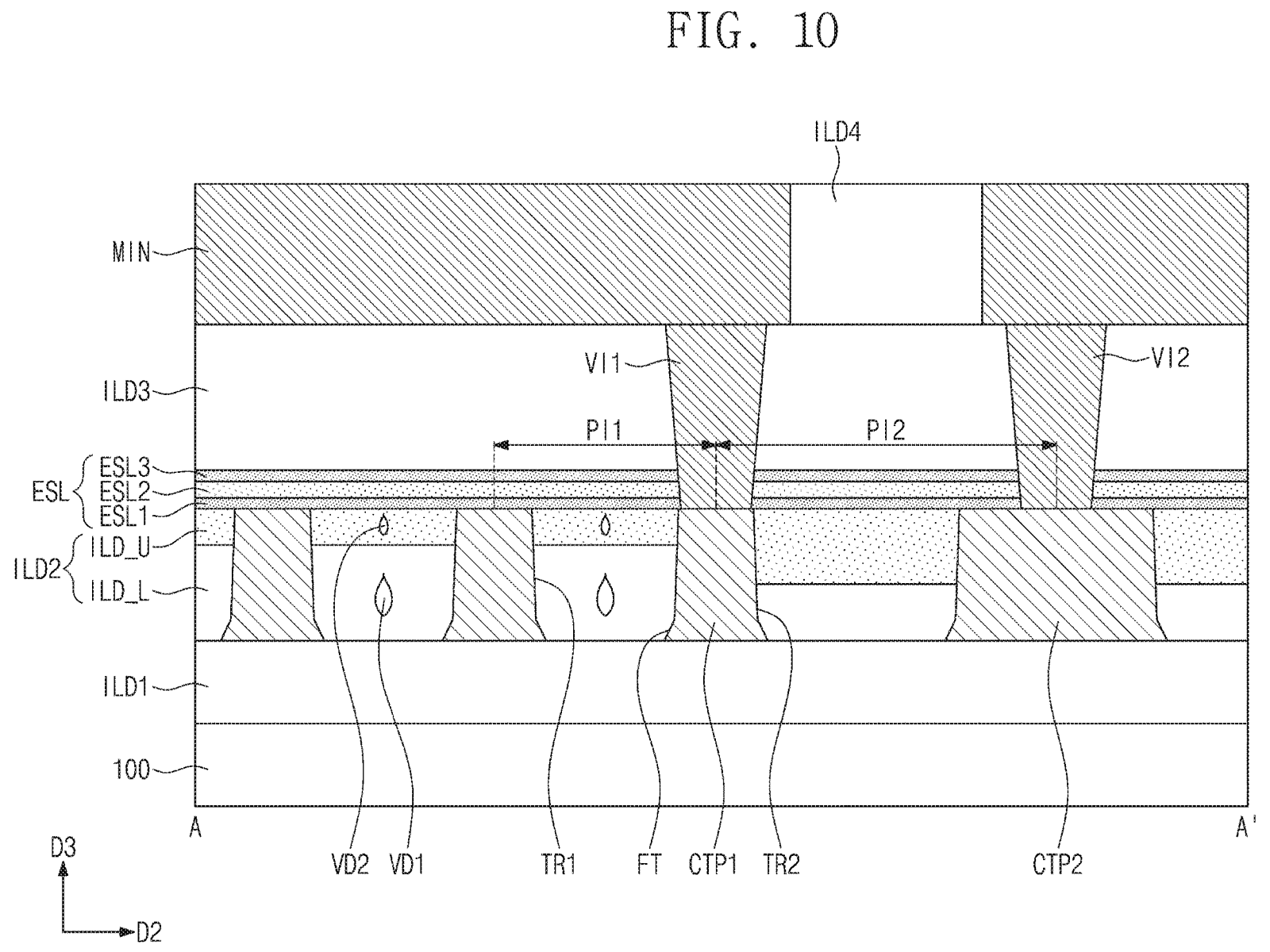
Figure 11:
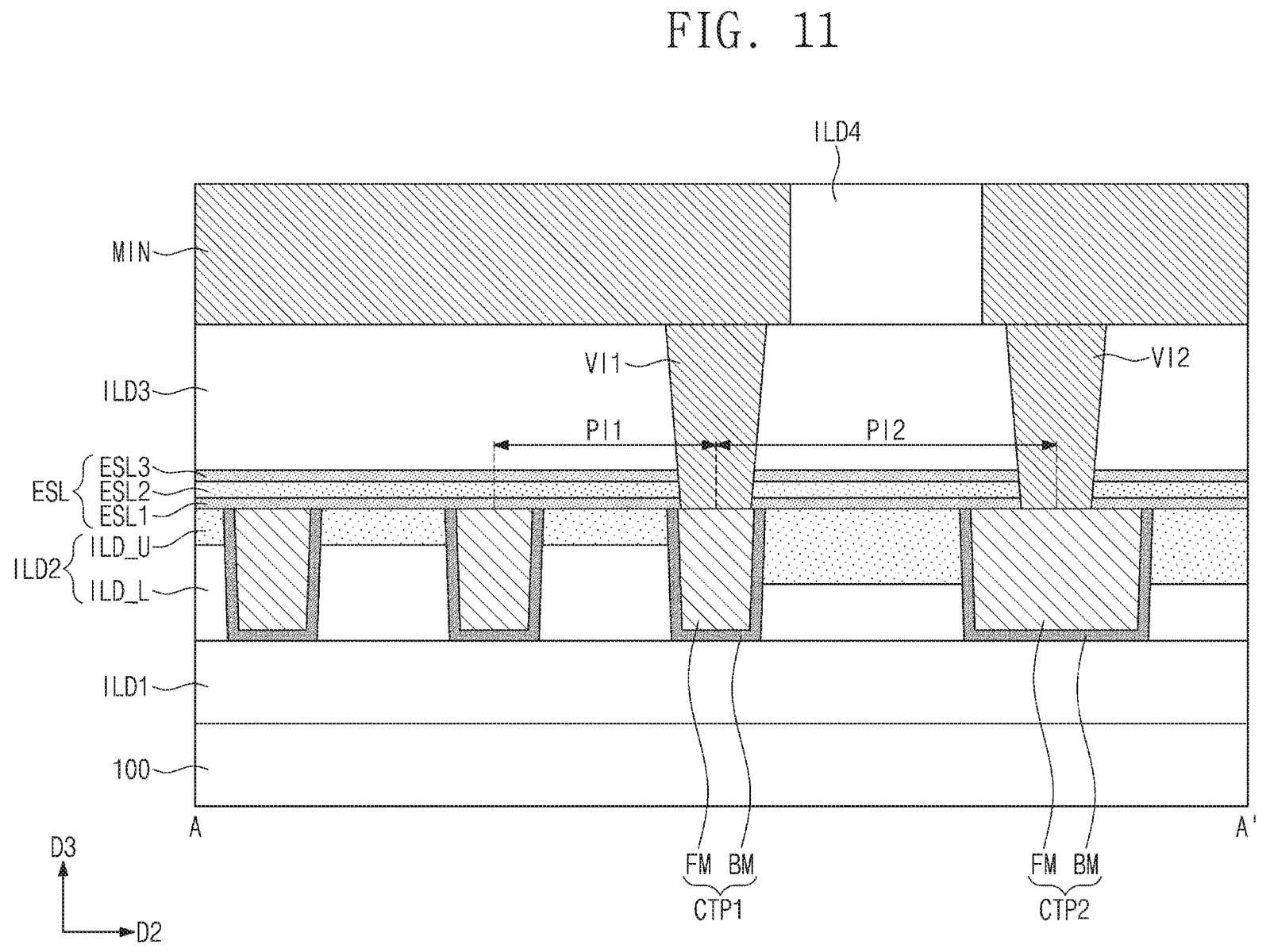

FIGS. 10 and 11 illustrate cross-sectional views taken along line A-A' of FIG. 1, showing a semiconductor device according to some embodiments of the present inventive concepts. A detailed description of technical features repetitive to those discussed above with reference to FIGS. 1 and 2 may be omitted, and a difference thereof is discussed in detail herein.

Referring to FIG. 10, a first air gap VD1 may be included in the lower interlayer dielectric layer ILD_L in the first trench TR1. A second air gap VD2 may be included in the upper interlayer dielectric layer ILD_U in the first trench TR1. The first air gap VD1 and the second air gap VD2 may vertically overlap each other. The first air gap VD1 and the second air gap VD2 may reduce a parasitic capacitance between neighboring first conductive structures CTP1, improving electrical properties of devices. No air gap may be present in the lower interlayer dielectric layer ILD_L in the second trench TR2. No air gap may be present in the upper interlayer dielectric layer ILD_U in the second trench TR2.

Referring to FIG. 11, each of the first conductive structures CTP1 and second conductive structures CTP2 may include a conductive pattern FM and a barrier pattern BM that surrounds the conductive pattern FM. The conductive pattern FM may include a metal. For example, the conductive pattern FM may include at least one of aluminum (Al), copper (Cu), tungsten (W), molybdenum (Mo), or cobalt (Co). The barrier pattern BM may cover sidewalls and a bottom surface of the conductive pattern FM. The barrier pattern BM may include a metal layer or a metal nitride layer. The barrier pattern BM metal layer may include, for example, at least one of titanium, tantalum, tungsten, nickel, cobalt, or platinum. The barrier pattern BM metal nitride layer may include, for example, at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

According to some embodiments of the present inventive concepts, the first and second conductive structures CTP1 and CTP2 of FIG. 11 may be formed by a damascene process. According to some embodiments of the present inventive concepts, the first and second conductive structures CTP1 and CTP2 of FIG. 11 may not be formed by an etching process. A damascene process may be used to form the first and second conductive structures CTP1 and CTP2, and one or more dielectric layers around the first and second conductive structures CTP1 and CTP2 may be omitted. Processes discussed with reference to FIGS. 6 to 8 may be performed to sequentially form the lower interlayer dielectric layer ILD_L and the upper interlayer dielectric layer ILD_U.

Figure 12:
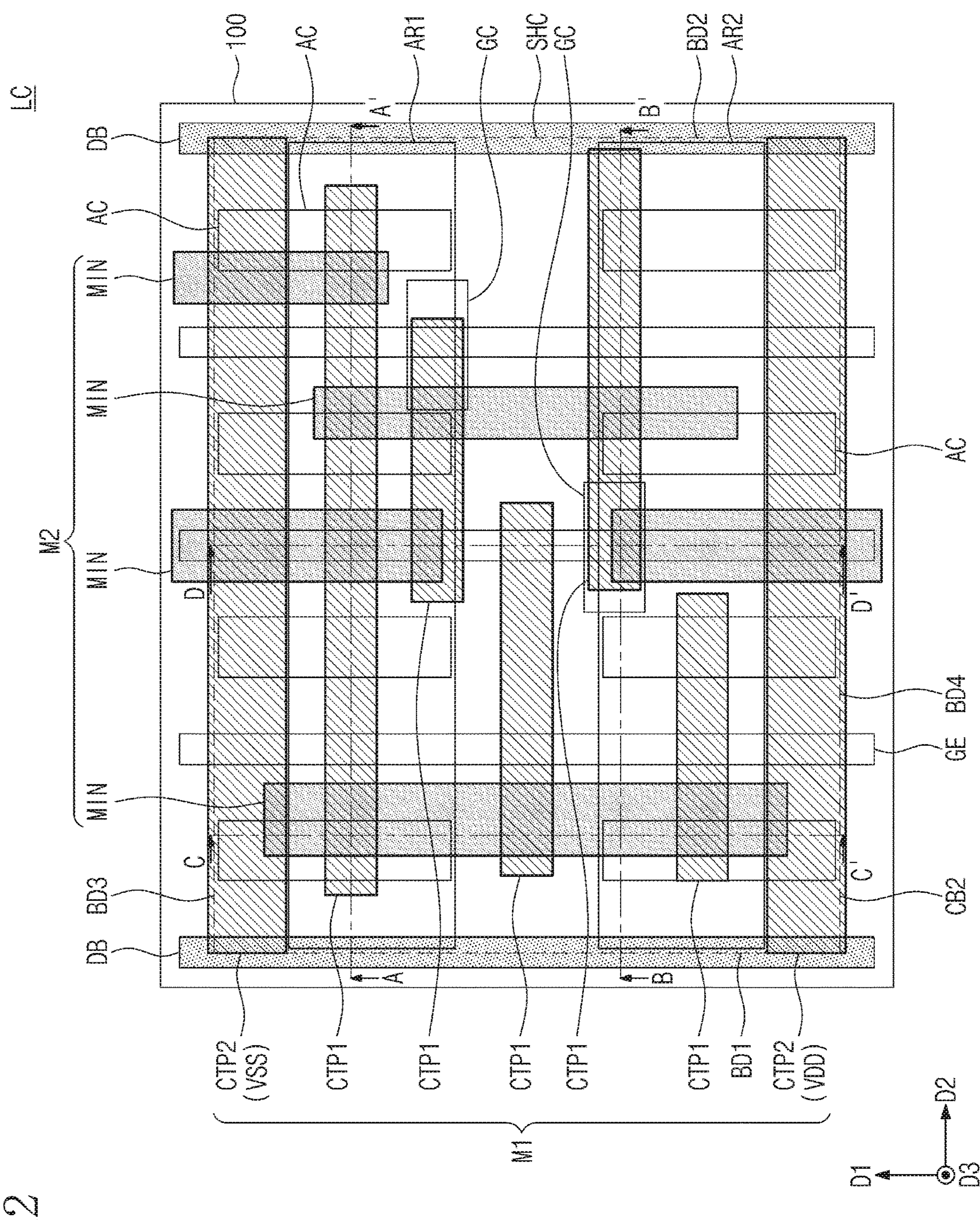
FIG. 12 illustrates a plan view showing a semiconductor device according to some embodiments of the present inventive concepts.

FIG. 12 illustrates a plan view showing a semiconductor device according to some embodiments of the present inventive concepts. FIGS. 13A, 13B, 13C, and 13D illustrate cross-sectional views respectively taken along lines A-A', B-B', C-C', and D-D' of FIG. 12.

Referring to FIGS. 12, 13A, 13B, 13C, and 13D, a logic cell LC may be provided on a substrate 100. In this description, the language "logic cell" may mean a logic device (e.g., inverter or flip-flop) that performs a specific function. For example, the logic cell LC may include transistors that constitute a logic device, and may also include wiring lines to connect the transistors to each other.

The substrate 100 may include a first active region AR1 and a second active region AR2. Each of the first and second active regions AR1 and AR2 may extend in a second direction D2. In an embodiment, the first active region AR1 may be an NMOSFET region, and the second active region AR2 may be a PMOSFET region.

A first active pattern AP1 and a second active pattern AP2 may be defined by a trench TR formed on an upper portion of the substrate 100. The first active pattern AP1 may be provided on the first active region AR1, and the second active pattern AP2 may be provided on the second active region AR2. The first active pattern AP1 and second active pattern AP2 may extend in the second direction D2. The first active pattern AP1 and second active pattern AP2 may be vertically protruding portions of the substrate 100.

A device isolation layer ST may be provided on the substrate 100. The device isolation layer ST may fill the trench TR. The device isolation layer ST may include a silicon oxide layer. The device isolation layer ST may not cover any of first and second channel patterns CH1 and CH2.

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2, and a third semiconductor pattern SP3 that are sequentially stacked. The first semiconductor pattern SP1, second semiconductor pattern SP2, and third semiconductor pattern SP3 may be spaced apart from each other in a vertical direction (or a third direction D3).

Each of the first semiconductor pattern SP1, second semiconductor pattern SP2, and third semiconductor pattern SP3 may include silicon (Si), germanium (Ge), or silicon-germanium (SiGe). For example, each of the first semiconductor pattern SP1, second semiconductor pattern SP2, and third semiconductor pattern SP3 may include crystalline silicon, for example, monocrystalline silicon. In an embodiment of the present inventive concepts, the first semiconductor pattern SP1, second semiconductor pattern SP2, and third semiconductor pattern SP3 may be stacked nanosheets.

Figure 13A:
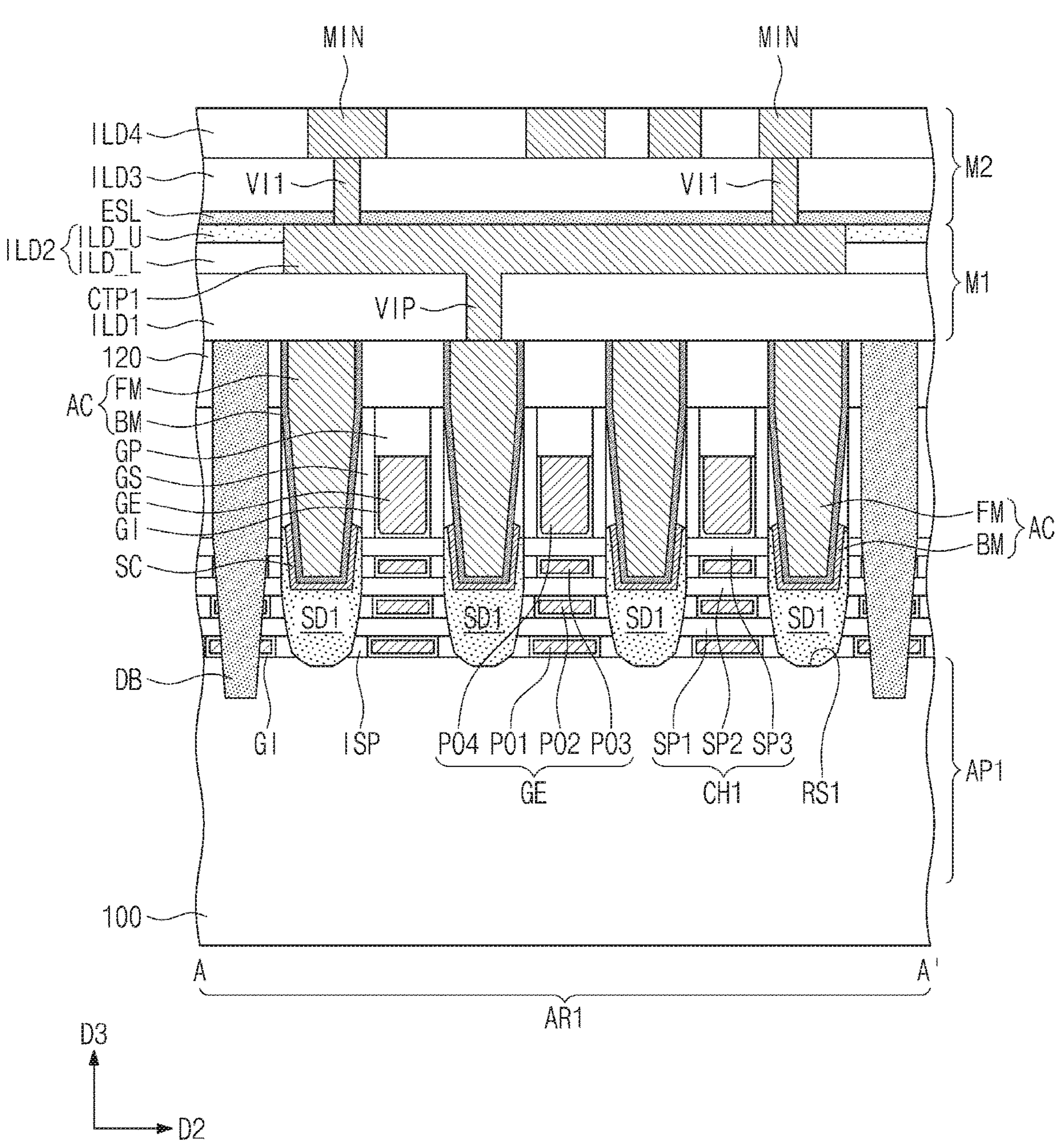
FIG. 13A illustrates a cross-sectional view taken along line A-A' of FIG. 12.
Figure 13B:
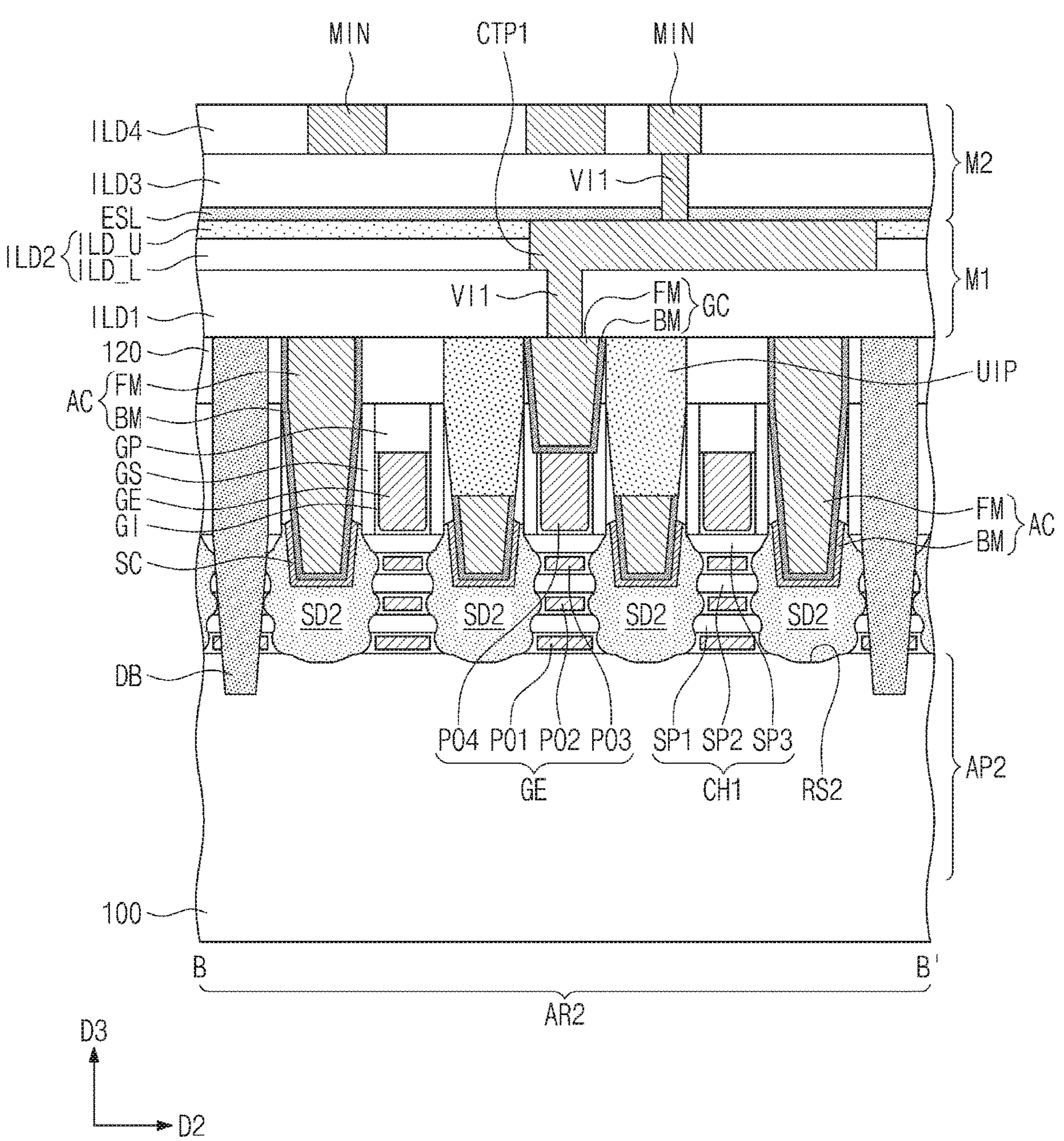
FIG. 13B illustrates a cross-sectional view taken along lines B-B' of FIG. 12.
Figure 13C:
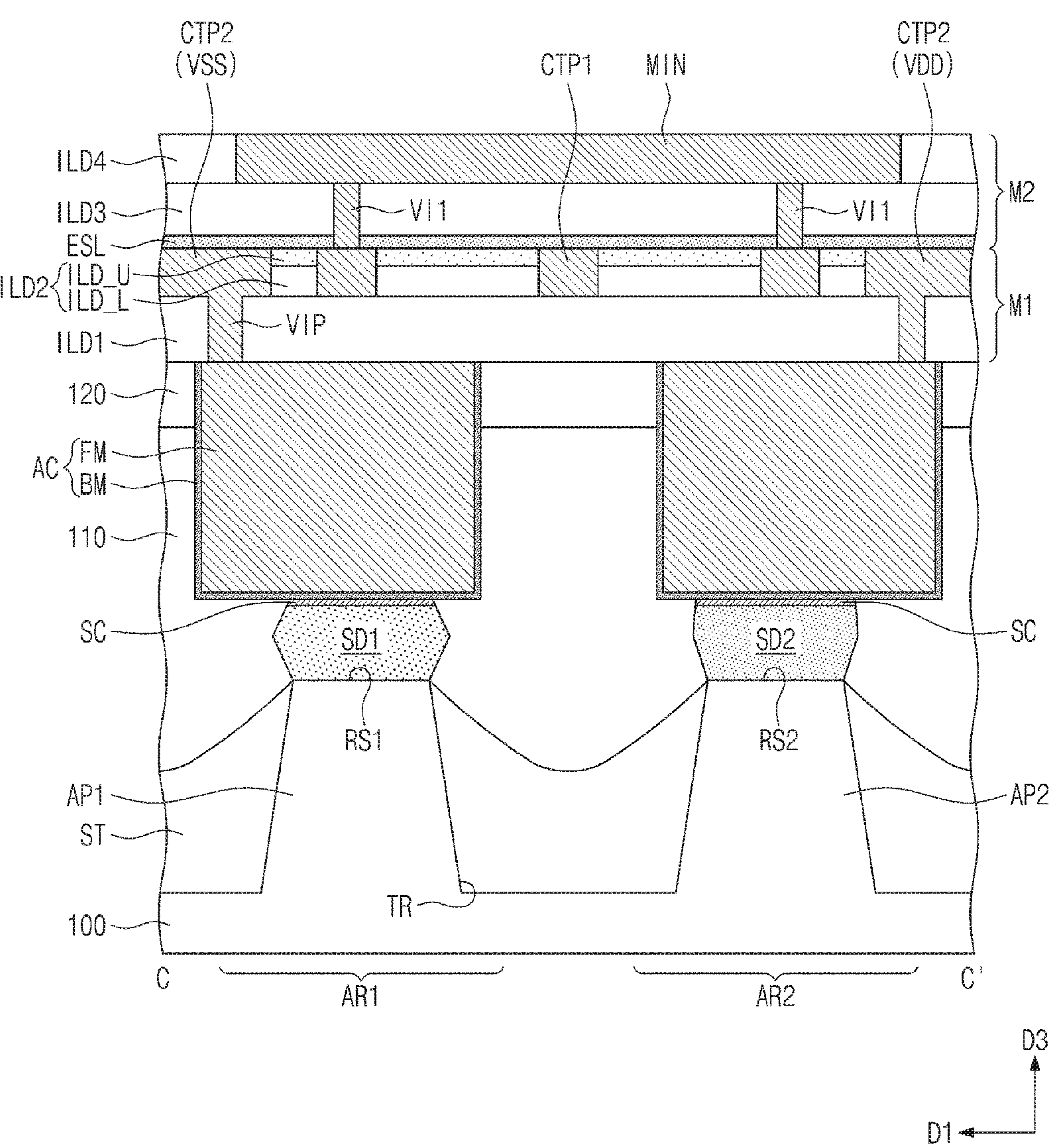
FIG. 13C illustrates a cross-sectional view taken along line C-C' of FIG. 12.

Referring to FIG. 13C, a plurality of first source/drain patterns SD1 may be provided on the first active pattern AP1. A plurality of first recesses RS1 may be formed on an upper portion of the first active pattern AP1. First source/drain patterns SD1 may be provided in the first recesses RS1. The first source/drain patterns SD1 may be impurity regions of a first conductivity type (e.g., n-type). The first channel pattern CH1 may be interposed between a pair of first source/drain patterns SD1. For example, the pair of first source/drain patterns SD1 may be connected to each other through the stacked first semiconductor pattern SP1, second semiconductor pattern SP2, and third semiconductor pattern SP3.

A plurality of second source/drain patterns SD2 may be provided on the second active pattern AP2. A plurality of second recesses RS2 may be formed on an upper portion of the second active pattern AP2. Second source/drain patterns SD2 may be provided in the second recesses RS2. The second source/drain patterns SD2 may be impurity regions of a second conductivity type (e.g., p-type). The second channel pattern CH2 may be interposed between a pair of second source/drain patterns SD2. For example, the pair of second source/drain patterns SD2 may be connected to each other through the stacked first semiconductor pattern SP1, second semiconductor patterns SP2, and third semiconductor pattern SP3.

The first source/drain patterns SD1 and second source/drain patterns SD2 may be epitaxial patterns formed by a selective epitaxial growth process. For example, each of the first source/drain patterns SD1 and the second source/drain patterns SD2 may have a top surface higher than that of the third semiconductor pattern SP3. For another example, at least one of the first source/drain patterns SD1 or the second SD2 may have a top surface at substantially the same level as a top surface of the third semiconductor pattern SP3.

In an embodiment of the present inventive concepts, the first source/drain patterns SD1 may include the same semiconductor element (e.g., Si) as that of the substrate 100. The second source/drain patterns SD2 may include a semiconductor element (e.g., SiGe) whose lattice constant may be greater than a lattice constant of a semiconductor element of the substrate 100. Therefore, a pair of second source/drain patterns SD2 may provide the second channel pattern CH2 with compressive stress.

In an embodiment of the present inventive concepts, the second source/drain pattern SD2 may have an uneven shape at a sidewall thereof. For example, the sidewall of the second source/drain pattern SD2 may have a wave-shape profile. The sidewall of the second source/drain pattern SD2 may protrude toward first inner electrode PO1, second inner electrode PO2, and third inner electrode PO3 of a gate electrode GE.

Gate electrodes GE may be provided on each of the first and second channel patterns CH1 and CH2. Each of the gate electrodes GE may extend in a first direction D1, while running across the first and second channel patterns CH1 and CH2. Each of the gate electrodes GE may vertically overlap the first and second channel patterns CH1 and CH2. In some examples, the gate electrodes GE may be arranged at a regular interval along the second direction D2.

The gate electrode GE may include a first inner electrode PO1 interposed between the first semiconductor pattern SP1 and the active pattern AP1 or AP2, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3. For example, the first inner electrode PO1 may be disposed between neighboring ones of the semiconductor patterns in a vertical stack of the semiconductor patterns.

Figure 13D:
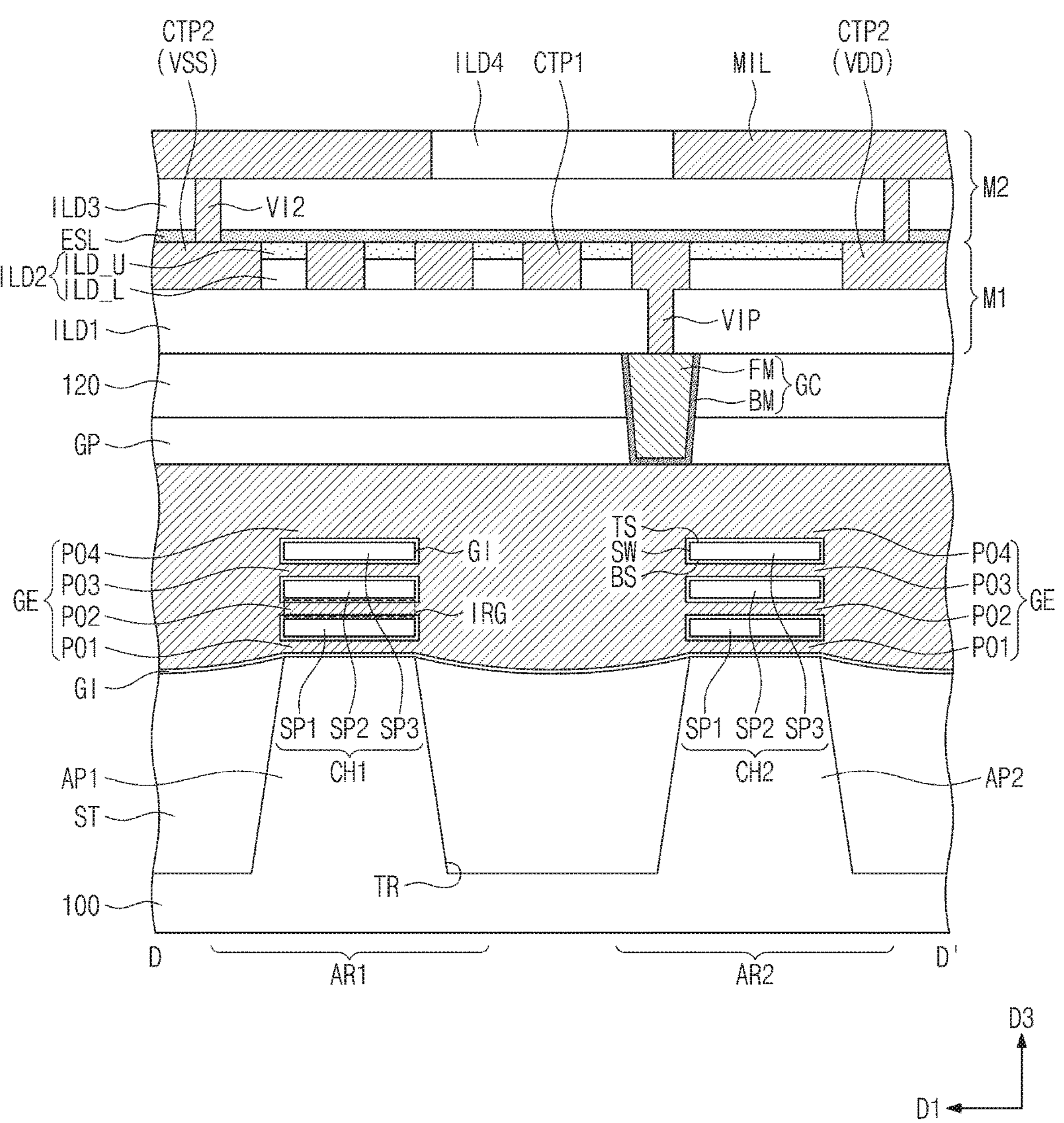
FIG. 13D illustrates a cross-sectional view taken along line D-D' of FIG. 12.

Referring to FIG. 13D, the gate electrode GE may be provided on a top surface TS, a bottom surface BS, and opposite sidewalls SW of each of the first semiconductor pattern SP1, the second semiconductor pattern SP2, and the third semiconductor pattern SP3. For example, a transistor according to an embodiment may be a three-dimensional field effect transistor (e.g., MBCFET or GAAFET) in which the gate electrode GE three-dimensionally surrounds the first and second channel patterns CH1 and CH2.

On the first active region AR1, inner spacers ISP may be correspondingly interposed between the first source/drain pattern SD1 and the first inner electrode PO1, second inner electrode PO2, and third inner electrode PO3 of the gate electrode GE. Each of the first inner electrode PO1, the second inner electrode PO2, and the third inner electrode PO3 of the gate electrode GE may be spaced apart from the first source/drain pattern SD1 across the inner spacer ISP. The inner spacer ISP may prevent a leakage current from the gate electrode GE.

Referring again to FIGS. 12, 13A, 13B, 13C, and 13D, a pair of gate spacers GS may be disposed on opposite sidewalls of the outer electrode PO4 of the gate electrode GE. The gate spacers GS may extend in the first direction D1 along the gate electrode GE. The gate spacers GS may have top surfaces higher than top surfaces of the gate electrode GE. The top surfaces of the gate spacers GS may be coplanar with top surfaces of a first dielectric layer 110.

In an embodiment, the gate spacers GS may include, for example, at least one of SiCN, SiCON, or SiN. In another embodiment, the gate spacers GS may include a multiple layer structure formed of, for example, at least two of SiCN, SiCON, or SiN.

A gate capping pattern GP may be provided on the gate electrode GE. The gate capping pattern GP may extend in the first direction D1 along the gate electrode GE. The gate capping patterns GP may include a material having an etch selectivity with respect to first dielectric layer 110 and second dielectric layer 120 as discussed herein. For example, the gate capping pattern GP may include, for example, at least one of SiON, SiCN, SiCON, or SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite side-walls SW of each of the first, second, and third semiconductor patterns SP1, SP2, and SP3. The gate dielectric layer GI may cover a top surface of the device isolation layer ST that underlies the gate electrode GE. The gate dielectric layer GI may not be formed on a top surface of the gate electrode GE.

In an embodiment of the present inventive concepts, the gate dielectric layer GI may include one or more of a silicon oxide layer, a silicon oxynitride layer, or a high-k dielectric layer. For example, the gate dielectric layer GI may have a structure in which a silicon oxide layer and a high-k dielectric layer are stacked. The high-k dielectric layer may include a high-k dielectric material whose dielectric constant may be greater than a dielectric constant of a silicon oxide layer. The high-k dielectric material may include, for example, at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Alternatively, a semiconductor device according to the present inventive concepts may include a negative capacitance field effect transistor that may use a negative capacitor. For example, the gate dielectric layer GI may include a ferroelectric material layer that may exhibit ferroelectric properties and a paraelectric material layer that may exhibit paraelectric properties.

The gate electrode GE may include a first metal pattern and a second metal pattern on the first metal pattern. The first metal pattern may be provided on the gate dielectric layer GI and may be adjacent to the first semiconductor pattern SP1, second semiconductor pattern SP1, and the third semiconductor pattern SP3. The first metal pattern may include a work-function metal that controls a threshold voltage of a transistor. A thickness and composition of the first metal pattern may be adjusted to achieve a desired threshold voltage of a transistor. For example, the first inner electrode PO1, the second inner electrode PO2, and the third inner electrode PO3 of the gate electrode GE may be formed of a first metal pattern or a work-function metal.

The first metal pattern may include a metal nitride layer. For example, the first metal pattern may include nitrogen (N) and at least one of titanium (Ti), tantalum (Ta), aluminum (Al), tungsten (W), or molybdenum (Mo). In addition, the first metal pattern may further include carbon (C). The first metal pattern may include a plurality of stacked work-function metal layers.

The second metal pattern may include metal whose resistance may be less than a resistance of the first metal pattern. For example, the second metal pattern may include, for example, at least one of tungsten (W), aluminum (Al), titanium (Ti), or tantalum (Ta). For example, the outer electrode PO4 of the gate electrode GE may include a first metal pattern and a second metal pattern on the first metal pattern.

A first dielectric layer 110 may be provided on the substrate 100. The first dielectric layer 110 may cover the gate spacers GS and the first and second source/drain patterns SD1 and SD2. The first dielectric layer 110 may have a top surface substantially coplanar with that of the gate capping pattern GP and that of the gate spacer GS. The first dielectric layer 110 may be provided thereon with a second dielectric layer 120 that covers the gate capping pattern GP.

The logic cell LC may have a first boundary BD1 and a second boundary BD2 that may be opposite to each other in the second direction D2. The first and second boundaries BD1 and BD2 may extend in the first direction D1. The logic cell LC may have a third boundary BD3 and a fourth boundary BD4 that may be opposite to each other in the first direction D1. The third and fourth boundaries BD3 and BD4 may extend in the second direction D2.

The logic cell LC may be provided on its opposite sides with a pair of separation structures DB that may be opposite to each other. For example, the pair of separation structures DB may be provided on the first and second boundaries BD1 and BD2 of the logic cell LC. The separation structure DB may extend in the first direction D1 parallel to the gate electrodes GE.

The separation structure DB may penetrate the first dielectric layer 110 and the second dielectric layer 120 and extend into the first active pattern AP1 and the second active pattern AP2. The separation structure DB may penetrate an upper portion of each of the first active pattern AP1 and the second active pattern AP2. The separation structure DB may electrically separate the active region of the logic cell LC from the active region of another cell.

Active contacts AC may be provided to penetrate the first dielectric layer 110 and the second dielectric layer 120 to be electrically connected to the first source/drain pattern SD1 and the second source/drain pattern SD2. A pair of active contacts AC may be provided on opposite sides of the gate electrode GE, respectively. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first source/drain pattern SD1 and the second source/drain pattern SD2. For example, the metal-semiconductor compound layer SC may include, for example, at least one of titanium silicide, tantalum silicide, tungsten silicide, nickel silicide, or cobalt silicide.

Gate contacts GC may be provided to penetrate the second dielectric layer 120 and the gate capping pattern GP to be electrically connected to the gate electrodes GE. When viewed in plan, the gate contacts GC may be disposed to overlap each of the first active region AR1 and the second active region AR2. For example, the gate contact GC may be provided on the second active pattern AP2 (see FIG. 13B).

In an embodiment of the present inventive concepts, referring to FIG. 13B, the active contact AC may have an upper portion adjacent to the gate contact GC. An upper dielectric pattern UIP may fill the upper portion of the active contact AC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. In a case where the top surface of the active contact AC adjacent to the gate contact GC may be lower than the bottom surface of the gate contact GC, an electrical short-circuit resulting from contact between the gate contact GC and its adjacent active contact AC may be prevented.

Each of the active contact AC and the gate contact GC may include a conductive pattern FM and a barrier pattern BM that surrounds the conductive pattern FM. For example, the conductive pattern FM may include, for example, at least one of aluminum, copper, tungsten, molybdenum, or cobalt. The barrier pattern BM may cover sidewalls and a bottom surface of the conductive pattern FM. The barrier pattern BM may include a metal layer and a metal nitride layer. The metal layer may include, for example, at least one of titanium, tantalum, tungsten, nickel, cobalt, or platinum. The metal nitride layer may include, for example, at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be provided on the second dielectric layer 120. The first metal layer M1 may include a first interlayer dielectric layer ILD1 and a second interlayer dielectric layer ILD2. The first interlayer dielectric layer ILD1 and the second interlayer dielectric layer ILD2 may be sequentially stacked. The second interlayer dielectric layer ILD2 may include a lower interlayer dielectric layer ILD_L and an upper interlayer dielectric layer ILD_U. The second interlayer dielectric layer ILD2 may be provided with first and second conductive structures CTP1 and CTP2 therein. A detailed description of the first metal layer M1 may be substantially the same as that discussed above with reference to FIGS. 1 and 2.

The second conductive structures CTP2 may be provided on the third boundary BD3 and the fourth boundary BD4 of the logic cell LC. A source voltage line VSS of the second conductive structures CTP2 may extend in the second direction D2 along the third boundary BD3. A drain voltage line VDD of the second conductive structures CTP2 may extend in the second direction D2 along the fourth boundary BD4.

The first interlayer dielectric layer ILD1 may be provided therein with a via part VIP that connects one of the active contact AC and the gate contact GC to one of the conductive structures CTP1 and CTP2. The via part VIP and one of the conductive structures CTP1 and CTP2 may be connected into a single unitary conductor.

A second metal layer M2 may be provided on the second interlayer dielectric layer ILD2. The second metal layer M2 may include an etch stop layer ESL, a third interlayer dielectric layer ILD3, and a fourth interlayer dielectric layer ILD4. The etch stop layer ESL, the third interlayer dielectric layer ILD3, and the fourth interlayer dielectric layer ILD4 may be sequentially stacked. The third interlayer dielectric layer ILD3 may be provided with a first via VI1 and a second via VI2 therein. The fourth interlayer dielectric layer ILD4 may be provided with metal lines MIN therein. A detailed description of the second metal layer M2 may be substantially the same as that discusses above with reference to FIGS. 1 and 2.

Although not shown, metal layers (e.g., M3, M4, M5, etc.) may be additionally stacked on the fourth interlayer dielectric layer ILD4. Each of the stacked metal layers may include wiring lines for routing between cells.

FIGS. 14A to 19C illustrate cross-sectional views showing a method of fabricating a semiconductor device according to some embodiments of the present inventive concepts. In detail, FIGS. 14A, 15A, 16A, 17A, 18A, and 19A illustrate cross-sectional views taken along line A-A' of FIG. 12. FIGS. 16B, 17B, 18B, and 19B illustrate cross-sectional views taken along line B-B' of FIG. 12. FIGS. 16C and 17C illustrate cross-sectional views taken along line C-C' of FIG. 12. FIGS. 14B, 15B, 18C, and 19C illustrate cross-sectional views taken along line D-D' of FIG. 12.

Figure 14A:
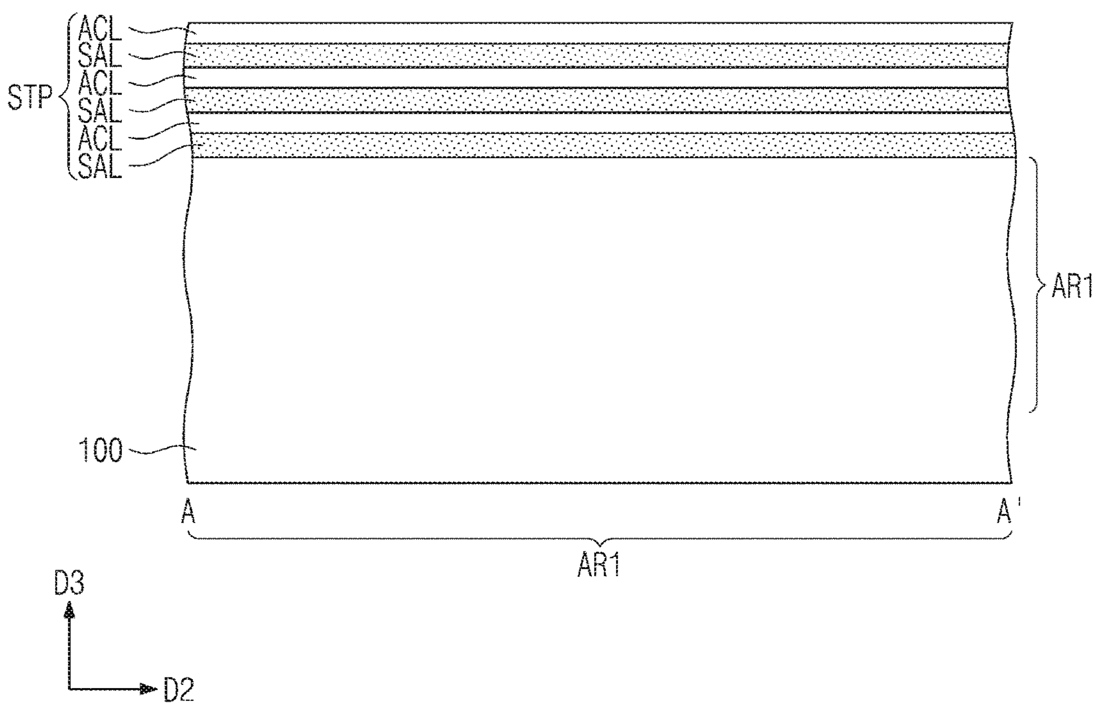
FIG. 14A, FIG. 14B, FIG. 15A, FIG. 15B, FIG. 16A, FIG. 16B, FIG. 16C, FIG. 17A, FIG. 17B, FIG. 17C, FIG. 18A.
Figure 14B:
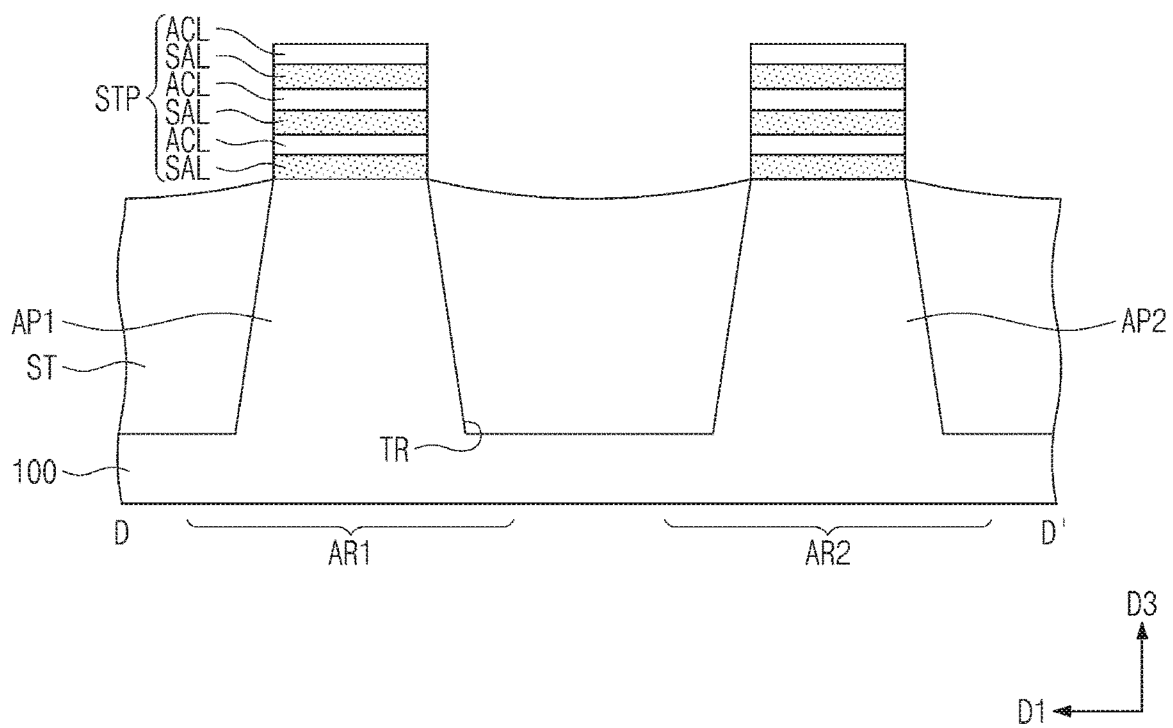

Referring to FIGS. 14A and 14B, a substrate 100 may be provided which includes a first active region AR1 and a second active region AR2. Active layers ACL and sacrificial layers SAL may be alternately stacked on the substrate 100. The active layers ACL may include silicon (Si), germanium (Ge), or silicon-germanium (SiGe), and the sacrificial layers SAL may include silicon (Si), germanium (Ge), or silicon-germanium (SiGe).

The sacrificial layer SAL may include a material having an etch selectivity with respect to the active layer ACL. For example, the active layers ACL may include silicon (Si), and the sacrificial layers SAL may include silicon-germanium (SiGe). Each of the sacrificial layers SAL may have a germanium concentration of about 10 at % to about 30 at %.

Mask patterns may be formed on each of the first active region AR1 and the second active region AR2 of the substrate 100. The mask pattern may have a linear or bar shape that extends in a second direction D2.

A patterning process may be performed in which the mask patterns are used as an etching mask. The etching mask may be used to form a trench TR that defines a first active pattern AP1 and a second active pattern AP2. The first active pattern AP1 may be formed on the first active region AR1. The second active pattern AP2 may be formed on the second active region AR2.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first active pattern AP1 and the second active pattern AP2.

A device isolation layer ST may be formed to fill the trench TR. For example, a dielectric layer may be formed on an entire surface of the substrate 100 to cover the stack patterns STP and the first active pattern AP1 and the second active pattern AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwards from the device isolation layer ST.

Figure 15A:
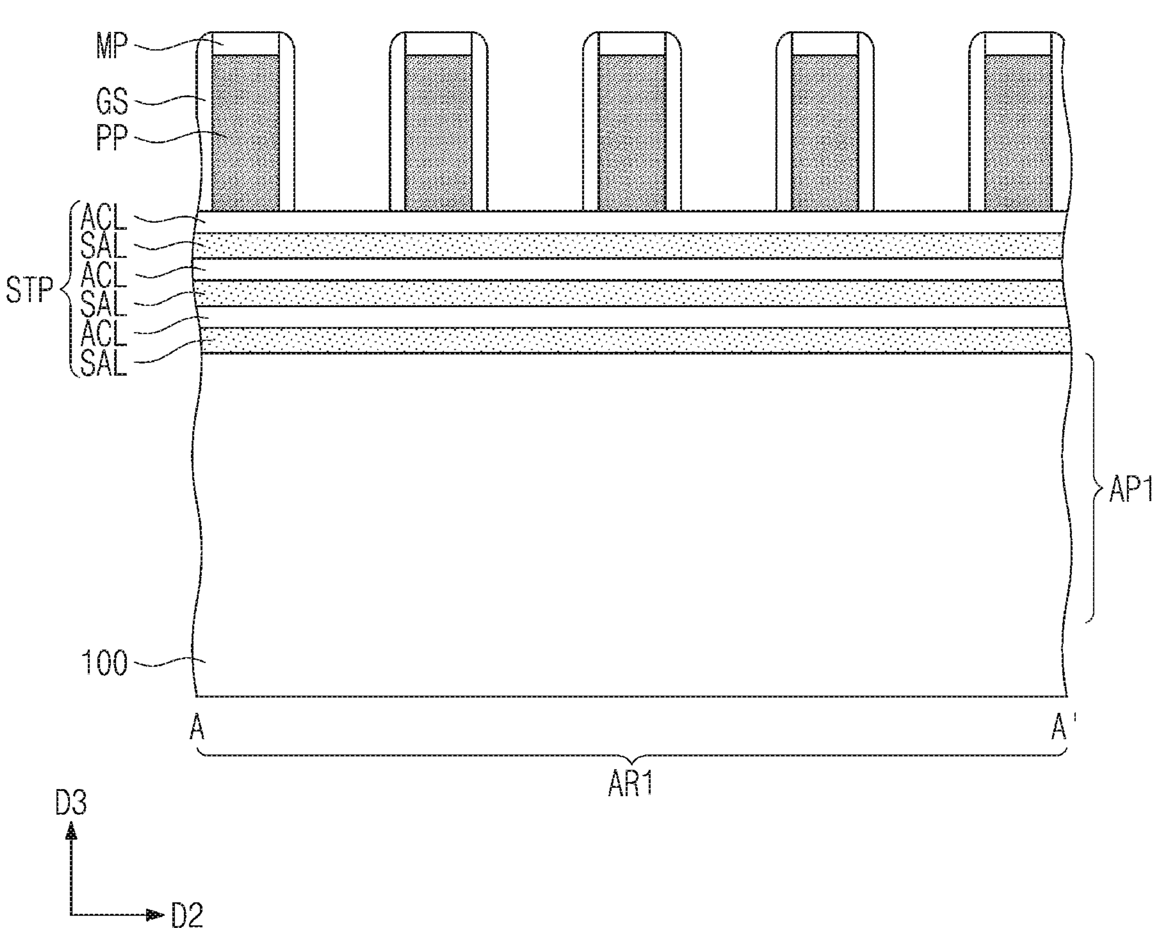
Figure 15B:
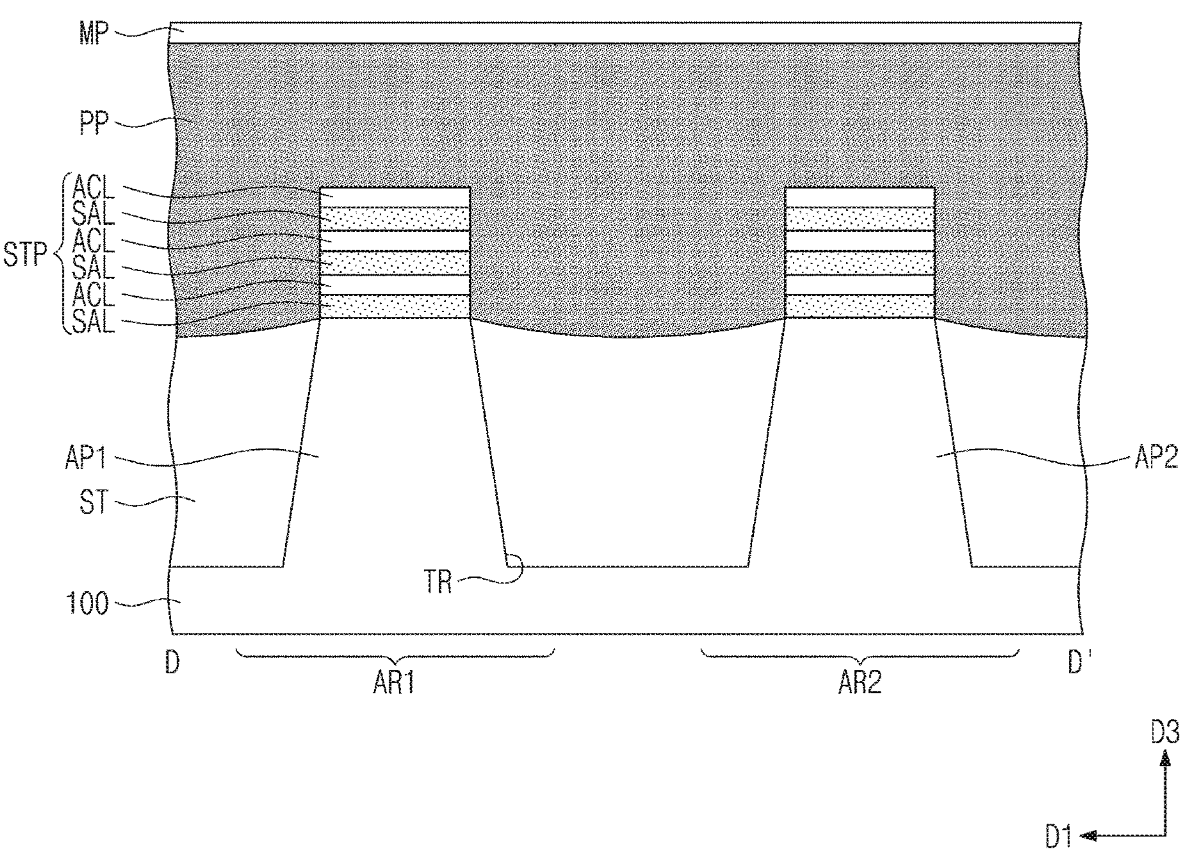

Referring to FIGS. 15A and 15B, sacrificial patterns PP may be formed on the substrate 100, running across the stack patterns STP. Each of the sacrificial patterns PP may be formed to have a linear or bar shape that extends in a first direction D1. The sacrificial patterns PP may be arranged along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon, for example.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In an embodiment of the present inventive concepts, the gate spacer GS may be a multiple layer including at least two layers.

Figure 16A:
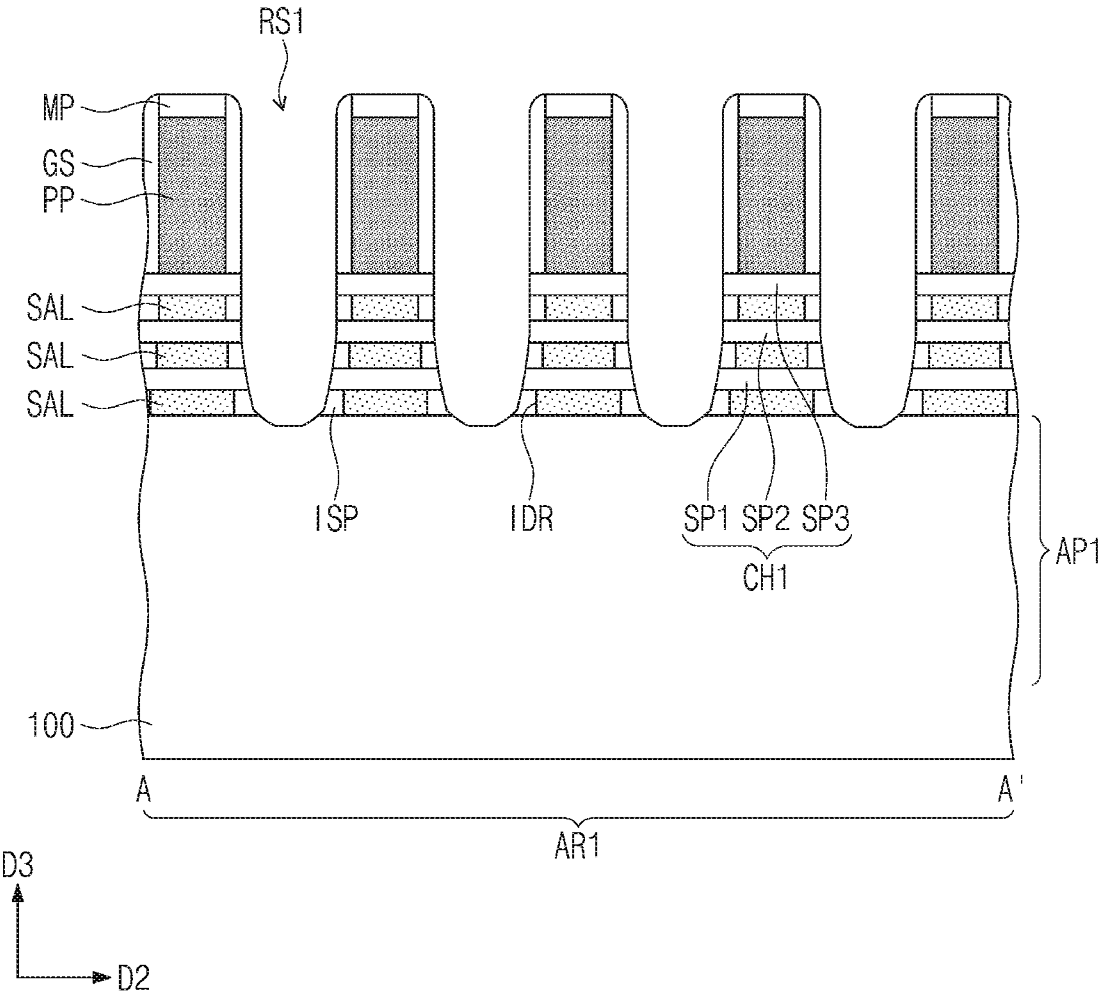
Figure 16B:
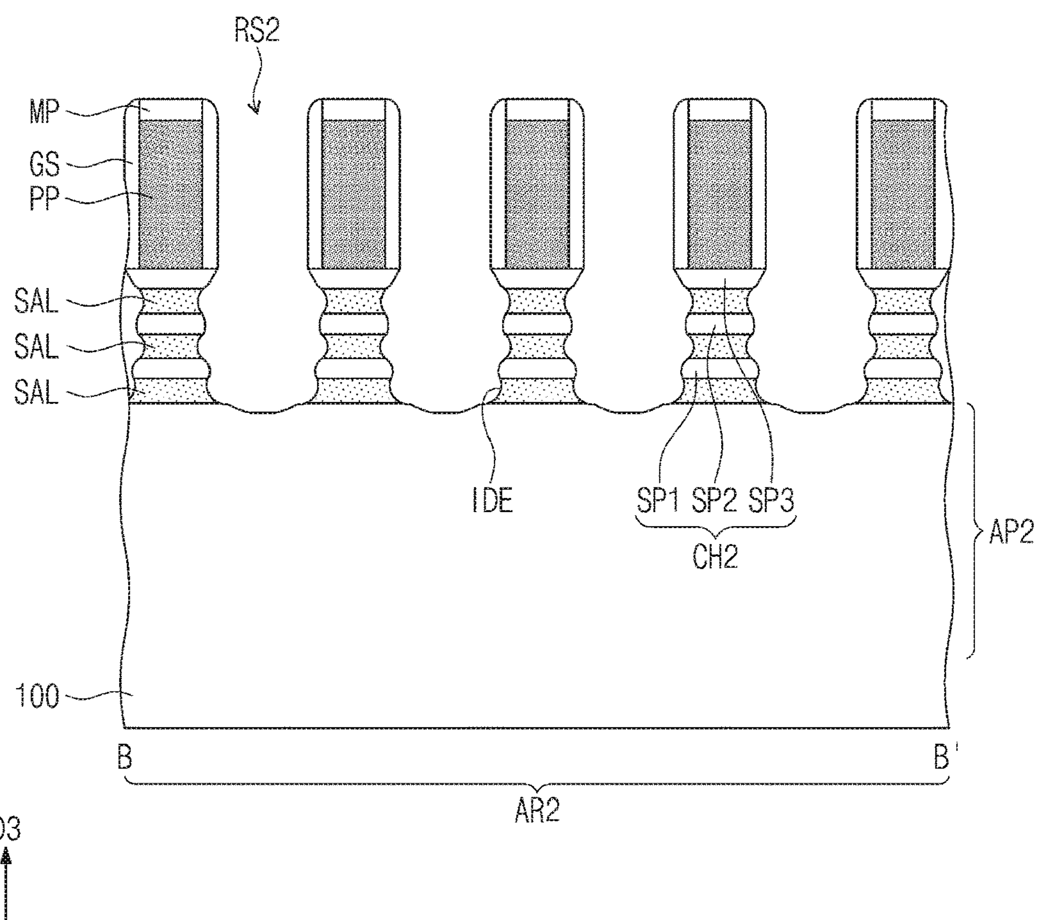
Figure 16C:
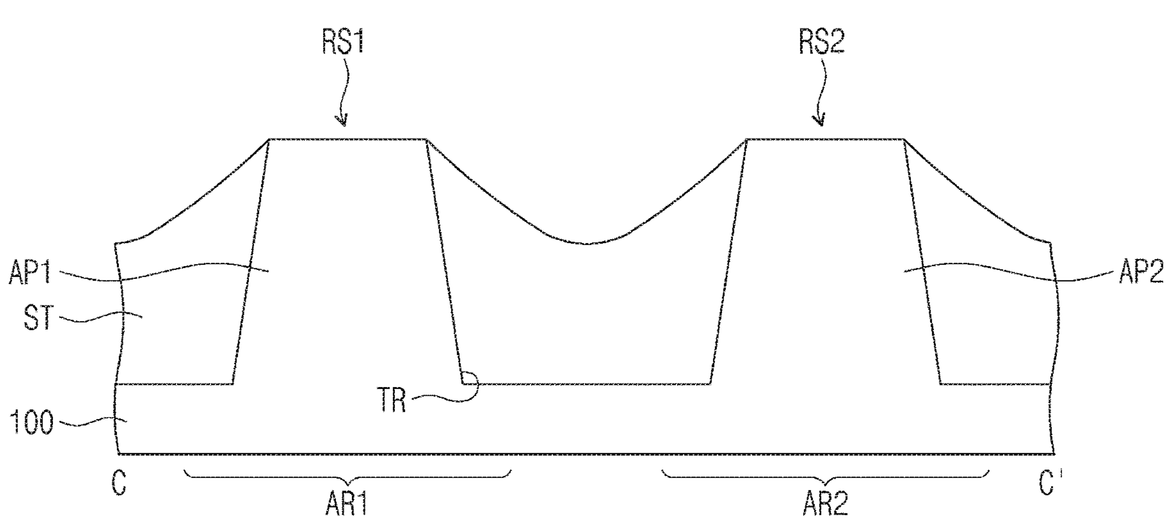

Referring to FIGS. 16A, 16B, and 16C, first recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST may further be recessed on opposite sides of each of the first and second active patterns AP1 and AP2 (see FIG. 16C).

For example, the hardmask patterns MP and the gate spacers GS may be used as an etching mask to etch the stack pattern STP on the first active pattern AP1 to form the first recesses RS1. The first recess RS1 may be formed between a pair of sacrificial patterns PP, for example.

The active layers ACL may be formed into a first semiconductor pattern SP1, a second semiconductor pattern SP2, and a third semiconductor pattern SP3. The first semiconductor pattern SP1, the second semiconductor pattern SP2, and the third semiconductor pattern SP3 may be sequentially stacked between neighboring first recesses RS1. A first channel pattern CH1 may be constituted by the first semiconductor pattern SP1, the second semiconductor pattern SP2, and the third semiconductor pattern SP3 between neighboring first recesses RS1.

The first recess RS1 may expose the sacrificial layers SAL. A selective etching process may be performed on the exposed sacrificial layers SAL. The etching process may include, for example, a wet etching process that selectively etches silicon-germanium. In the etching process, each of the sacrificial layers SAL may form an indent region IDR. Inner spacers ISP may be formed to fill the indent regions IDR.

The second recesses RS2 in the stack pattern STP on the second active pattern AP2 may be formed by a method similar to that used for forming the first recesses RS1. The sacrificial layers SAL exposed by the second recess RS2 may undergo a selective etching process to form indent regions IDE on the second active pattern AP2. The indent regions IDE may cause the second recess RS2 to have a wave-shape inner sidewall, for example. The inner spacers ISP may not be formed in the indent regions IDE on the second active pattern AP2. A second channel pattern CH2 may be constituted by the first semiconductor pattern SP1, the second semiconductor pattern SP2, and the third semiconductor pattern SP3 between neighboring second recesses RS2.

Figure 17A:
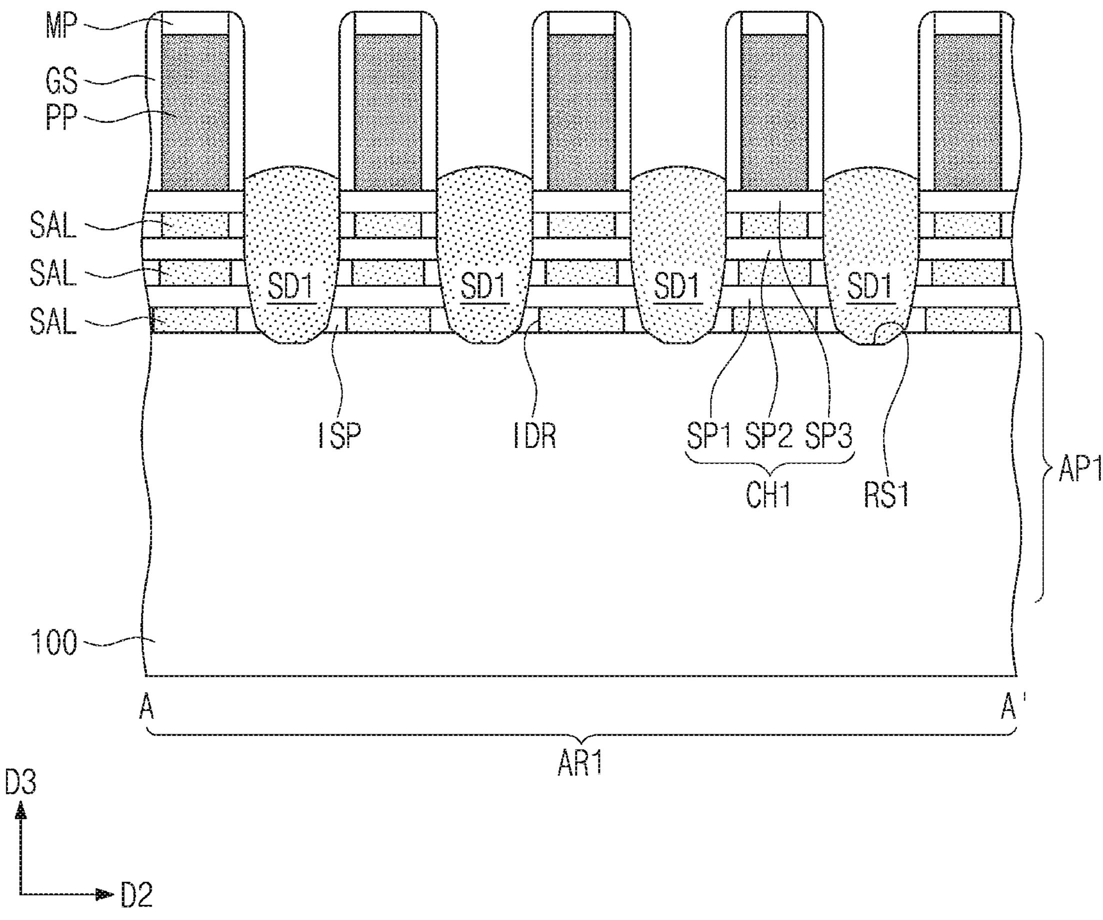
Figure 17B:
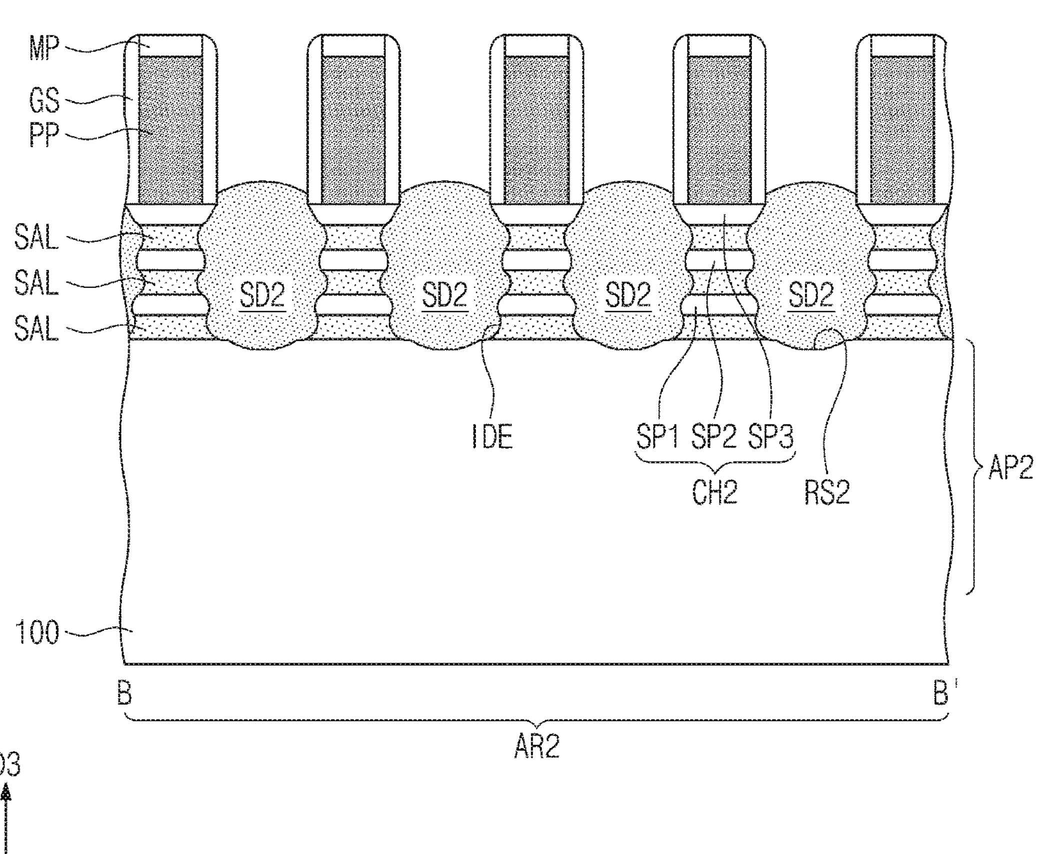
Figure 17C:
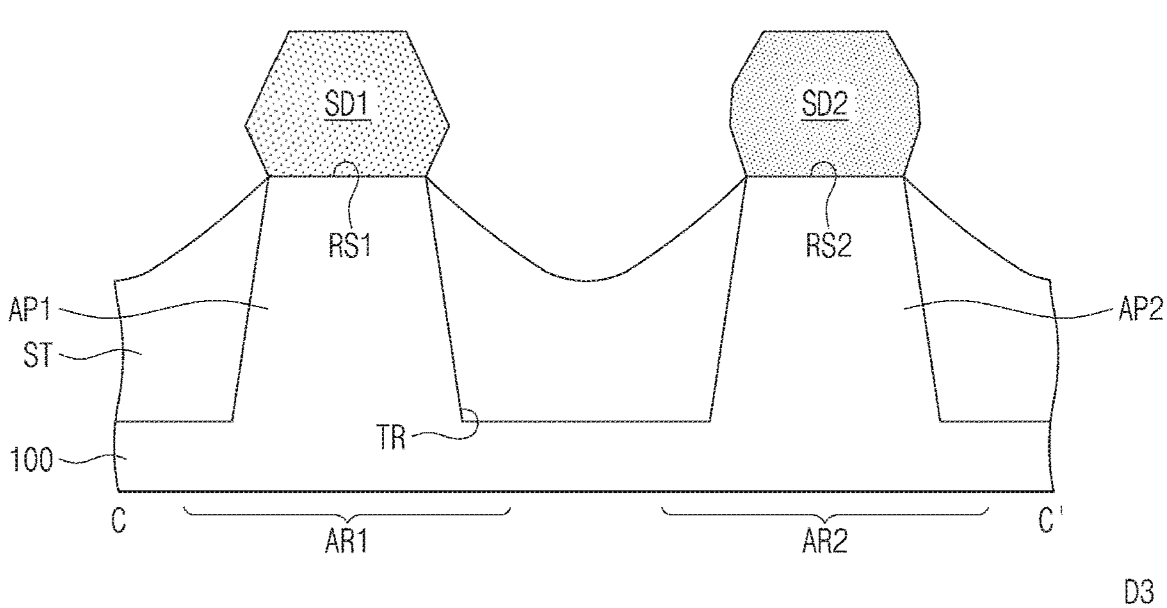

Referring to FIGS. 17A to 17C, first source/drain patterns SD1 may be correspondingly formed in the first recesses RS1. For example, a selective epitaxial growth (SEG) process may be performed such that an inner sidewall of the first recess RS1 may be used as a seed layer to form an epitaxial layer that fills the first recess RS1. The epitaxial layer may be grown from a seed or the substrate 100 and the first semiconductor pattern SP1, the second semiconductor pattern SP2, and the third semiconductor pattern SP3 exposed by the first recess RS1. For example, the SEG process may include chemical vapor deposition (CVD) or molecular beam epitaxy (MBE).

In an embodiment of the present inventive concepts, the first source/drain pattern SD1 may include the same semiconductor element (e.g., Si) as that of the substrate 100. While the first source/drain pattern SD1 is formed, impurities (e.g., phosphorus, arsenic, or antimony) may be in-situ implanted to allow the first source/drain pattern SD1 to have an n-type. Alternatively, after the first source/drain pattern SD1 is formed, impurities may be implanted into the first source/drain pattern SD1.

Second source/drain patterns SD2 may be formed in the second recesses RS2. For example, a selective epitaxial growth (SEG) process may be performed such that an inner sidewall of the second recess RS2 may be used as a seed to form the second source/drain pattern SD2.

In an embodiment of the present inventive concepts, the second source/drain pattern SD2 may include a semiconductor element (e.g., SiGe) whose lattice constant may be greater than a lattice constant of a semiconductor element of the substrate 100. While the second source/drain pattern SD2 is formed, impurities (e.g., boron, gallium, or indium) may be in-situ implanted to allow the second source/drain pattern SD2 to have a p-type. Alternatively, after the second source/drain pattern SD2 is formed, impurities may be implanted into the second source/drain pattern SD2.

Figure 18A:
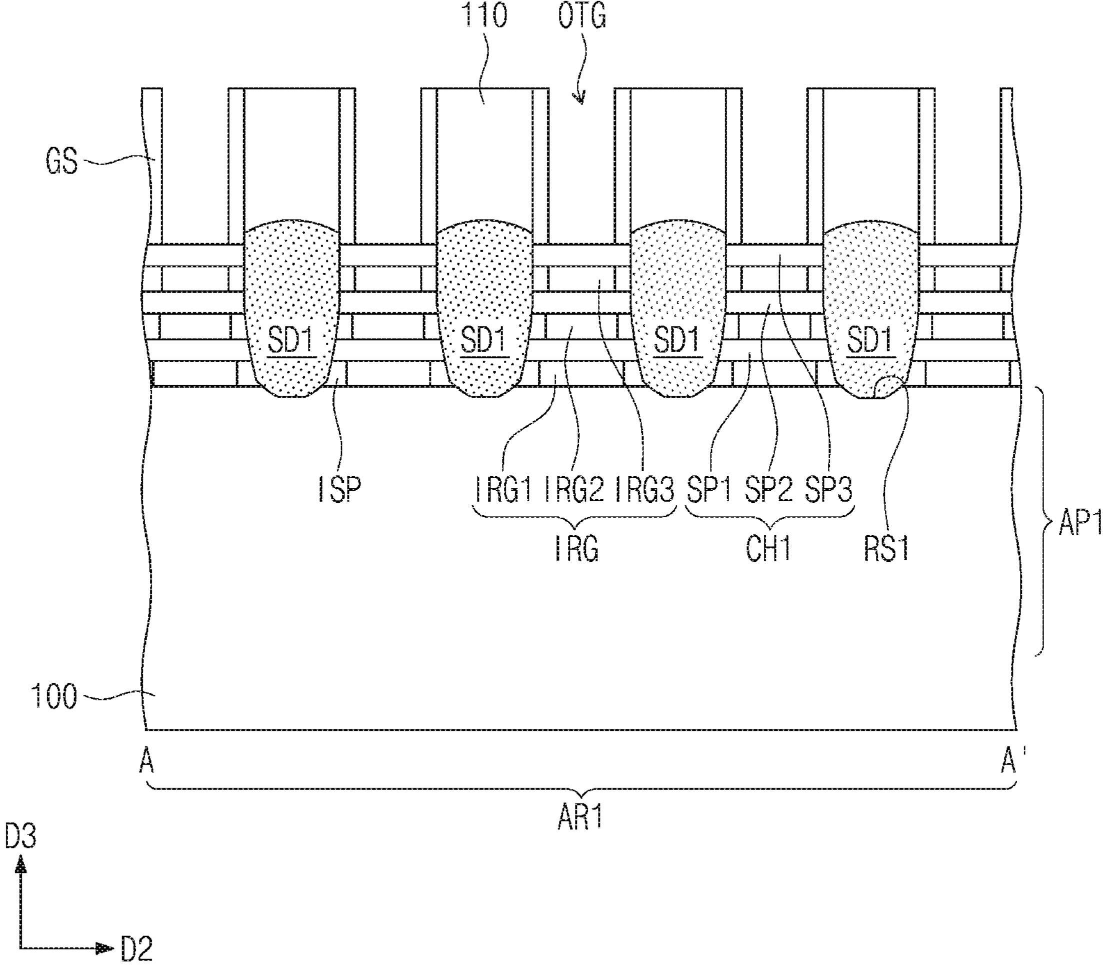
Figure 18B:
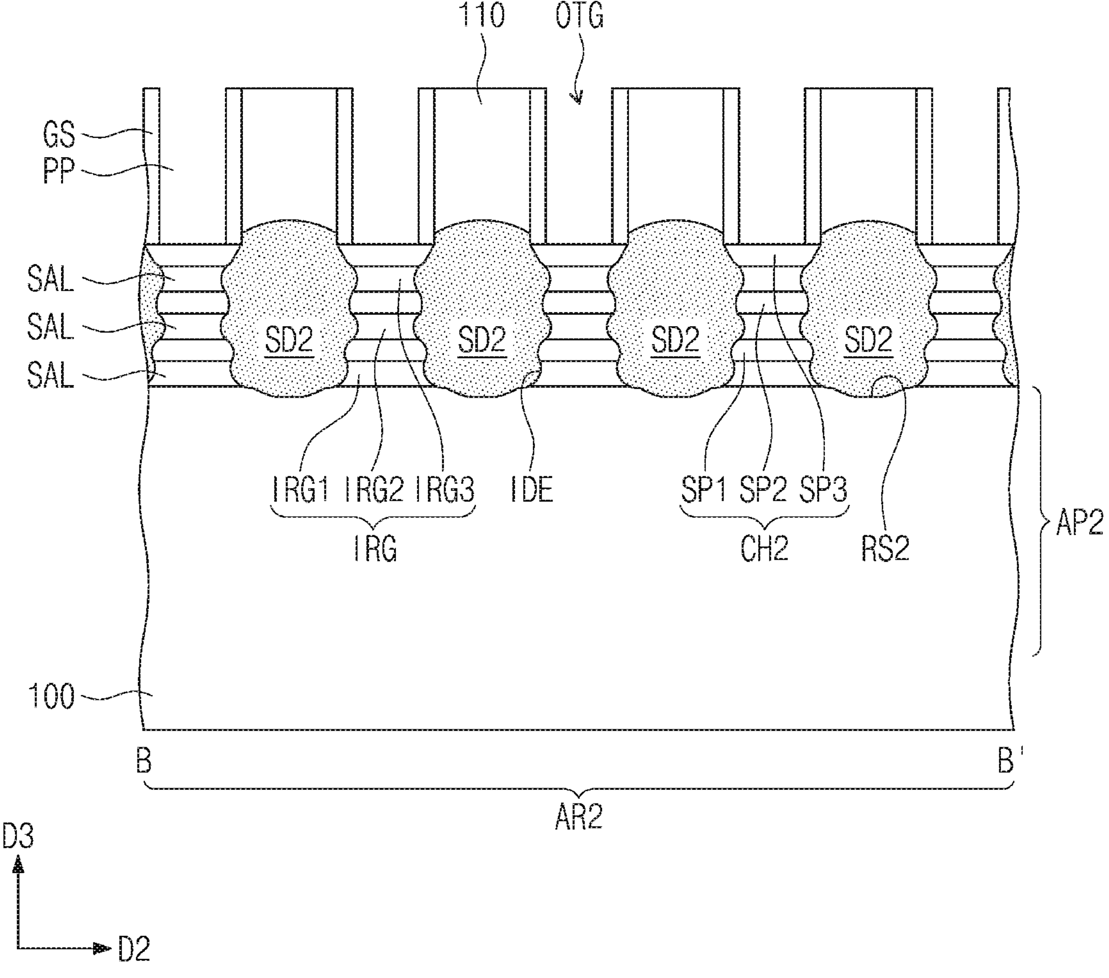
FIG. 18B, FIG. 18C, FIG. 19A, FIG. 19B, and FIG. 19C illustrate cross-sectional views showing a method of fabricating a semiconductor device according to some embodiments of the present inventive concepts.
Figure 18C:
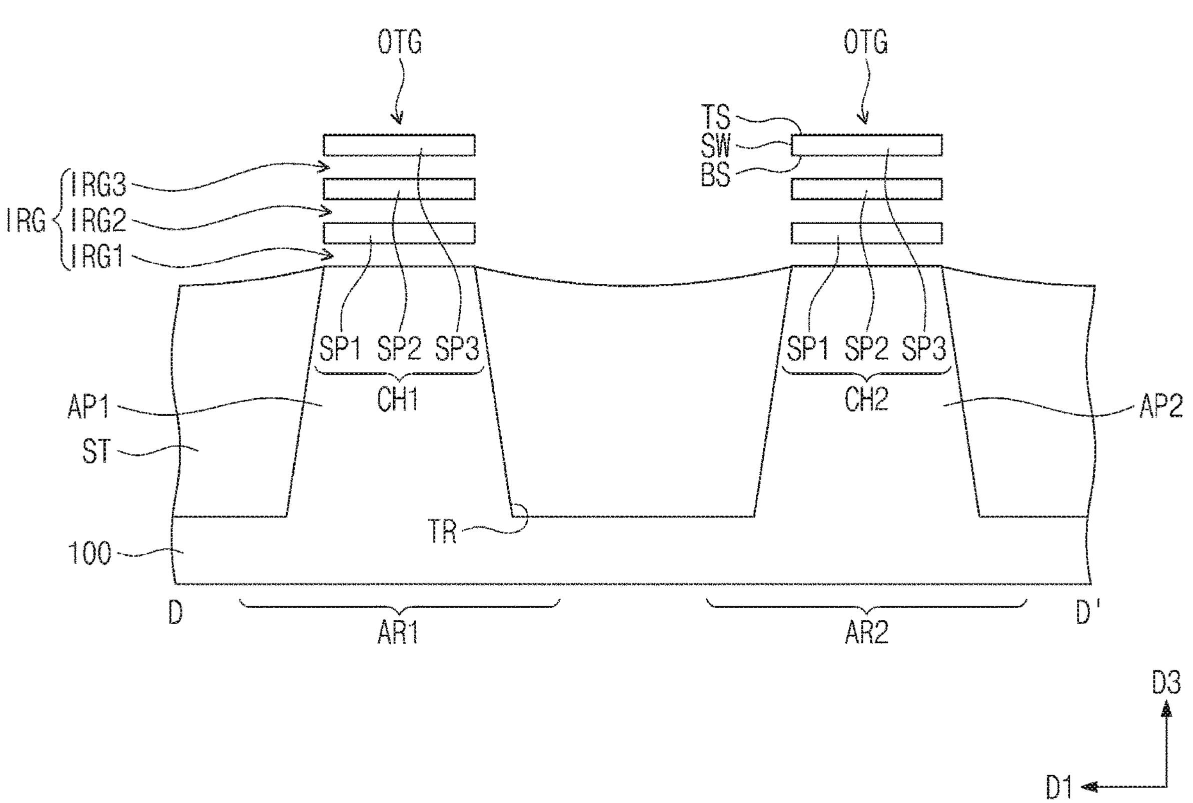

Referring to FIGS. 18A to 18C, a first dielectric layer 110 may be formed to cover the first source/drain patterns SD1 and the second source/drain patterns SD2, the hardmask patterns MP, and the gate spacers GS. For example, the first dielectric layer 110 may include a silicon oxide layer.

The first dielectric layer 110 may be planarized. The planarization of the first dielectric layer 110 may expose top surfaces of the sacrificial patterns PP. An etch-back or chemical mechanical polishing (CMP) process may be employed to planarize the first dielectric layer 110. The hardmask patterns MP may all be removed during the planarization process. As a result, the first dielectric layer 110 may have a top surface coplanar with those of the sacrificial patterns PP and those of the gate spacers GS.

In another example of the present inventive concepts, the description of the lower interlayer dielectric layer ILD_L and the upper interlayer dielectric layer ILD_U of the second interlayer dielectric layer ILD2 discussed above with reference to FIG. 2 may be substantially similar to the first dielectric layer 110. For example, the formation of the first dielectric layer 110 may include forming a lower interlayer dielectric layer ILD_L between the gate spacers GS, performing a planarization process on the lower interlayer dielectric layer ILD_L, forming a hard upper interlayer dielectric layer ILD_U on the lower interlayer dielectric layer ILD_L, and performing a planarization process on the upper interlayer dielectric layer ILD_U.

Referring again to FIGS. 18A to 18C, the exposed sacrificial patterns PP may be selectively removed. The removal of the sacrificial patterns PP may form an outer region ORG. The outer region ORG may expose the first channel pattern CH1 and the second channel pattern CH2 (see FIG. 18C). The removal of the sacrificial patterns PP may include performing a wet etching process using an etchant that selectively etches polysilicon.

The sacrificial layers SAL exposed through the outer region ORG may be selectively removed to form inner regions IRG (see FIG. 18C). For example, an etching process that selectively etches the sacrificial layers SAL may be performed such that the sacrificial layers SAL may be removed while leaving the first semiconductor patterns SP1, the second semiconductor patterns SP2, and the third semiconductor patterns P3. The etching process may have a high etch rate with respect to silicon-germanium having a relatively high germanium concentration. For example, the etching process may have a high etch rate with respect to silicon-germanium whose germanium concentration is greater than about 10 at %.

The etching process may remove the sacrificial layers SAL on the first and second active regions AR1 and AR2. The etching process may be a wet etching process. An etching material used for the etching process may promptly etch the sacrificial layer SAL whose germanium concentrate is relatively high.

Referring again to FIG. 18C, as the sacrificial layers SAL are selectively removed, the first semiconductor pattern SP1, the second semiconductor pattern SP2, and the third semiconductor pattern SP3 may remain on each of the first active pattern AP1 and the second active pattern AP2. The removal of the sacrificial layers SAL may form first, second, and third inner regions IRG1, IRG3, and IRG3.

For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Figure 19A:
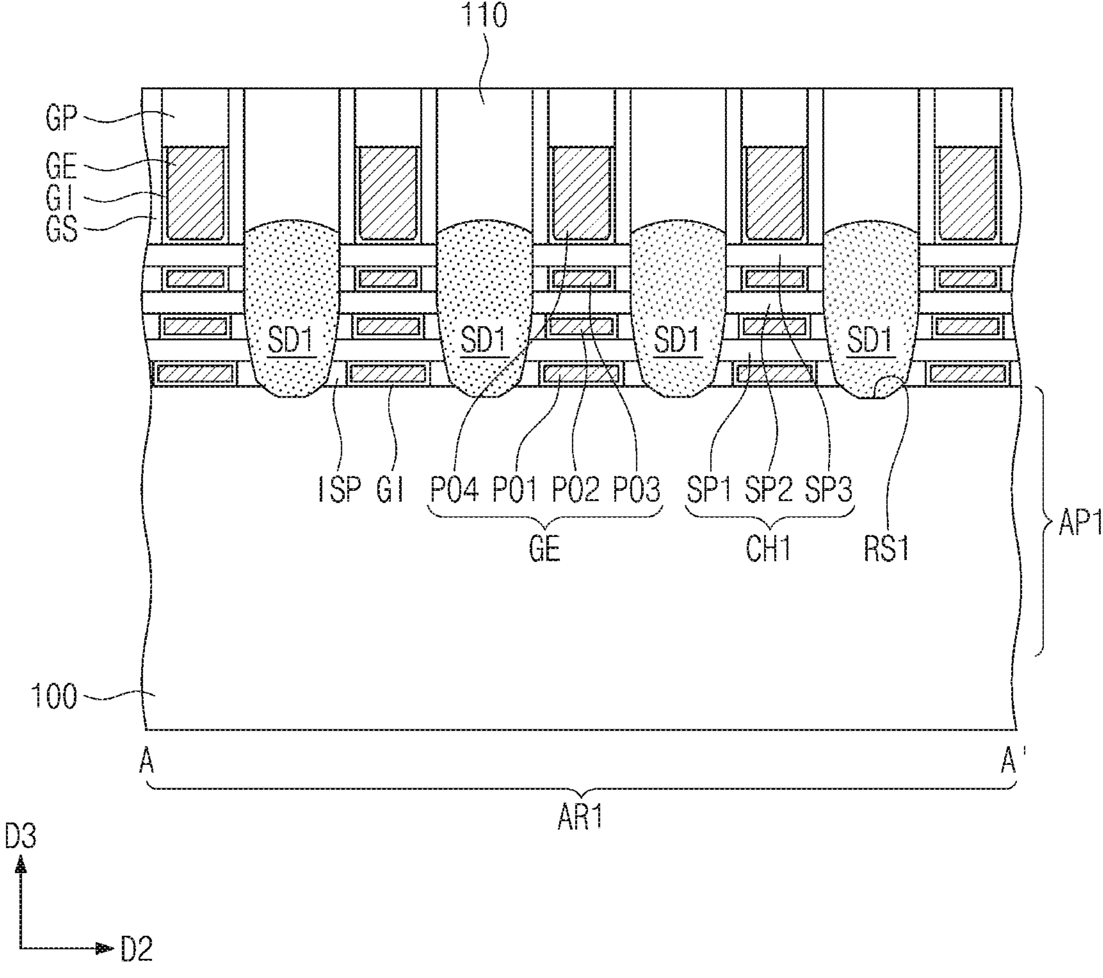
Figure 19B:
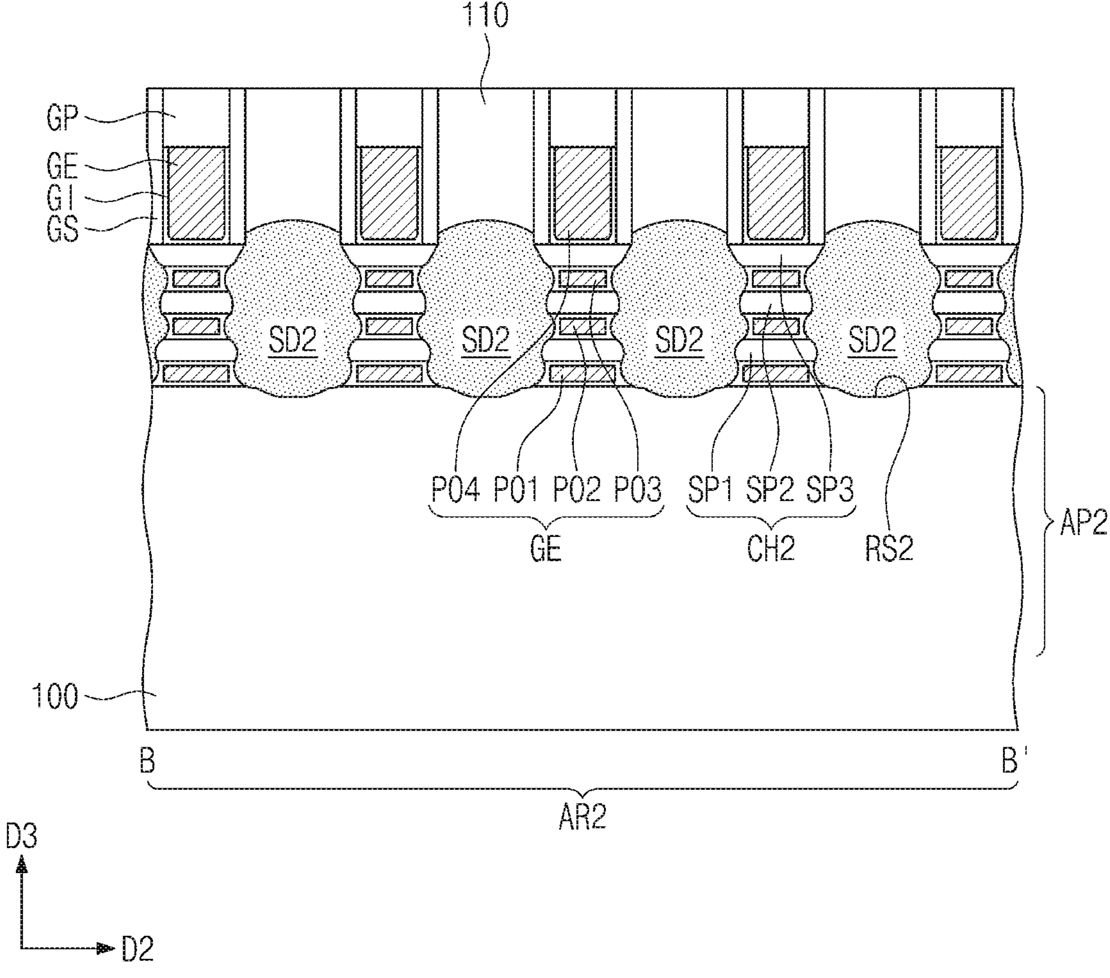
Figure 19C:
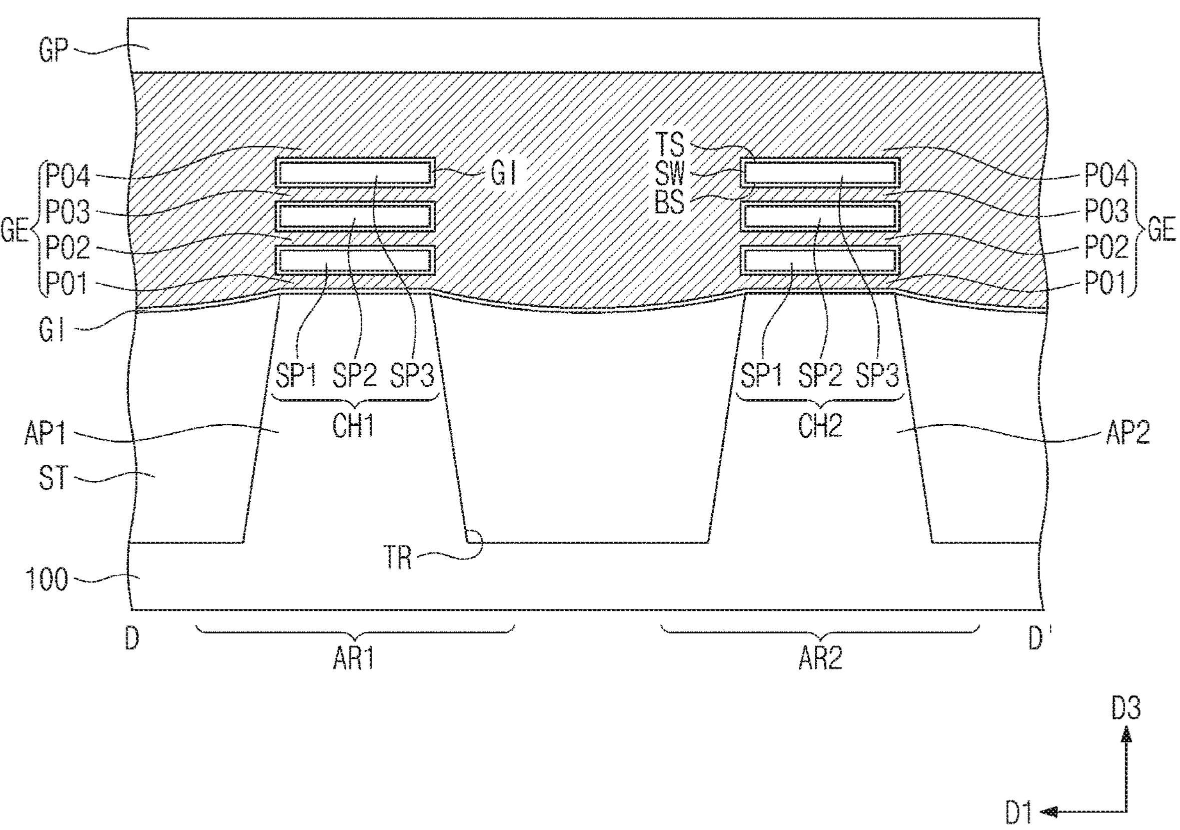

Referring to FIGS. 19A, 19B, and 19C, a gate dielectric layer GI may be formed on the exposed a first semiconductor pattern SP1, a second semiconductor pattern SP2, and a. third semiconductor pattern SP3. The gate dielectric layer GI may be formed to surround each of the first semiconductor pattern SP1, the second semiconductor pattern SP2, and the third semiconductor pattern SP3. The gate dielectric layer GI may be formed in each of the first inner region IRG1, the second inner region IRG2, and the third inner region IRG3. The gate dielectric layer GI may be formed in the outer region ORG.

A gate electrode GE may be formed on the gate dielectric layer GI. The gate electrode GE may include a first inner electrode PO1, a second inner electrode PO2, and a third inner electrode PO3 that are respectively formed in the first inner region IRG1, the second inner region IRG2, and the third inner region IRG3, and may also include an outer electrode PO4 formed in the outer region ORG. The gate electrode GE may be recessed to have a reduced height. A gate capping pattern GP may be formed on the recessed gate electrode GE, for example.

Referring again to FIGS. 13A, 13B, 13C, and 13D, a second dielectric layer 120 may be formed on the first dielectric layer 110. The second dielectric layer 120 may include a silicon oxide layer. Active contacts AC may be formed to penetrate the first dielectric layer 110 and the second dielectric layer 120. The Active contacts AC may have electrical connection with the first source/drain pattern SD1 and the second source/drain pattern SD2. A gate contact GC may be formed to penetrate the second dielectric layer 120 and the gate capping pattern GP. The gate contact GC may have electrical connection with the gate electrode GE.

The formation of each of the active contact AC and the gate contact GC may include forming a barrier pattern BM and forming a conductive pattern FM on the barrier pattern BM. The barrier pattern BM may be conformally formed and may include a metal layer and a metal nitride layer. The conductive patterns FM may include metal whose resistance is low, for example.

Separation structures DB may be formed on the first boundary BD1 and the second boundary BD2 of the logic cell LC. The separation structure DB may extend from the second dielectric layer 120 through the gate electrode GE into the active pattern AP1 or AP2. The separation structure DB may include a dielectric material, such as a silicon oxide layer or a silicon nitride layer.

A first metal layer M1 may be formed on the active contacts AC and the gate contacts GC. A second metal layer M2 may be formed on the first metal layer M1. The formation of the first metal layer M1 and the second metal layer M2 may be substantially the same as that discussed above with reference to FIGS. 1 to 8.

In a semiconductor device according to embodiments of the present inventive concepts, neighboring conductive structures may be provided with a lower interlayer dielectric layer therebetween whose dielectric constant is low, which may result in an improvement in electrical properties. Moreover, in a semiconductor device according to embodiments of the present inventive concepts, an upper interlayer dielectric layer having a high mechanical stiffness may be formed on the lower interlayer dielectric layer, and thus process defects in a top-tier layer may be prevented. A semiconductor device according to embodiments of the present inventive concepts may be increased reliability.

Although some embodiments of inventive concepts have been discussed with reference to accompanying figures, it will be understood that various changes in form and details may be made therein without departing from the spirit and scope of inventive concepts. Accordingly, example embodiments of the inventive concepts should be considered in all respects as illustrative and not restrictive, with the spirit and scope of the inventive concepts defined in the following claims.

What is claimed is:

1. A semiconductor device, comprising:

a substrate;

a plurality of conductive structures on the substrate, the conductive structures extending in parallel to each other in a first direction; and a first interlayer dielectric layer in a first trench and a second trench, the first and second trenches being between the conductive structures, wherein a width in a second direction of the first trench is less than a width in the second direction of the second trench, wherein the first interlayer dielectric layer includes a lower interlayer dielectric layer and an upper interlayer dielectric layer on the lower interlayer dielectric layer, wherein a mechanical strength of the upper interlayer dielectric layer is greater than a mechanical strength of the lower interlayer dielectric layer, and wherein a top surface of the upper interlayer dielectric layer in the first trench is at a level substantially same as a level of a top surface of the upper interlayer dielectric layer in the second trench.

2. The semiconductor device of claim 1, wherein the lower interlayer dielectric layer is formed by a flow fill process or a spin-on process, and the upper interlayer dielectric layer is formed by a chemical vapor deposition process.

3. The semiconductor device of claim 1, wherein a thickness of the lower interlayer dielectric layer in the first trench is greater than a thickness of the lower interlayer dielectric layer in the second trench.

4. The semiconductor device of claim 1, wherein a hardness of the upper interlayer dielectric layer is greater than a hardness of the lower interlayer dielectric layer, and wherein an elastic modulus of the upper interlayer dielectric layer is greater than an elastic modulus of the lower interlayer dielectric layer.

5. The semiconductor device of claim 4, wherein the mechanical strength of the upper interlayer dielectric layer results from the hardness and the elastic modulus of the upper interlayer dielectric layer.

6. The semiconductor device of claim 1, wherein an average size of pores in the upper interlayer dielectric layer is less than an average size of pores in the lower interlayer dielectric layer, and a porosity of the upper interlayer dielectric layer is less than a porosity of the lower interlayer dielectric layer.

7. The semiconductor device of claim 6, wherein the mechanical strength of the upper interlayer dielectric layer results from the porosity of the upper interlayer dielectric layer.

8. The semiconductor device of claim 1, wherein a dielectric constant of the upper interlayer dielectric layer is greater than a dielectric constant of the lower interlayer dielectric layer, and a concentration of carbon in the upper interlayer dielectric layer is greater than a concentration of carbon in the lower interlayer dielectric layer.

9. The semiconductor device of claim 8, wherein the mechanical strength of the upper interlayer dielectric layer results from the concentration of carbon in the upper interlayer dielectric layer.

10. The semiconductor device of claim 1, wherein each of the conductive structures includes a protruding footing at a lower portion thereof, and the lower interlayer dielectric layer in the first trench includes a lower part between the protruding footings and an upper part on the lower part, and a width of the upper part is greater than a width of the lower part.

11. The semiconductor device of claim 1, wherein the lower interlayer dielectric layer in the first trench includes a first air gap, the upper interlayer dielectric layer in the first trench includes a second air gap, and the first air gap and the second air gap vertically overlap each other.

12. The semiconductor device of claim 11, wherein the lower interlayer dielectric layer in the second trench includes no air gap, and the upper interlayer dielectric layer in the second trench includes no air gap.

13. The semiconductor device of claim 1, further comprising:

an active pattern on the substrate;

a channel pattern on the active pattern, the channel pattern including a plurality of semiconductor patterns that are spaced apart from and vertically stacked on each other;

a source/drain pattern connected to the semiconductor patterns;

a gate electrode on the semiconductor patterns, the gate electrode including an inner electrode disposed between neighboring ones of the semiconductor patterns in a vertical stack;

an active contact electrically connected to the source/drain pattern; and a gate contact electrically connected to the gate electrode, wherein the first interlayer dielectric layer is on the active contact and the gate contact, and wherein the conductive structures are electrically connected to the active contact and the gate contact.

14. The semiconductor device of claim 1, further comprising:

an etch stop layer that covers a top surface of the first interlayer dielectric layer and top surfaces of the conductive structures;

a second interlayer dielectric layer on the etch stop layer;

a via in the second interlayer dielectric layer and electrically connected to at least one of the conductive structures;

a third interlayer dielectric layer on the second interlayer dielectric layer; and a metal line in the third interlayer dielectric layer and on the via.

* * * * *